United States Patent [19]

Schumacher et al.

[11] Patent Number: 5,054,210

[45] Date of Patent: Oct. 8, 1991

[54] ISOPROPYL ALCOHOL VAPOR DRYER SYSTEM

[75] Inventors: Kevin Schumacher, North Caldwell, N.J.; Martin J. Striefler, New Hampton, N.Y.; Frank Cavaluzzi, Wurtsboro, N.Y.; Orazio Domicoli, Poughkeepsie, N.Y.

[73] Assignee: S&K Products International, Inc., Chestnut Ridge, N.Y.

[21] Appl. No.: 485,569

[22] Filed: Feb. 23, 1990

[51] Int. Cl.[5] .................. F26B 21/14; F26B 21/06; F26B 21/00; B08B 7/00

[52] U.S. Cl. .................................. 34/78; 34/73; 34/74; 134/105; 134/107

[58] Field of Search ............. 34/73, 74, 78; 134/105, 134/107

[56] References Cited

U.S. PATENT DOCUMENTS

| | | | |
|---|---|---|---|
| 4,008,729 | 2/1977 | Chizinsky | 134/107 |
| 4,077,467 | 3/1978 | Spigarelli | 134/107 X |
| 4,679,721 | 7/1987 | Kondo | 134/105 X |
| 4,777,970 | 10/1988 | Kusuhara | 219/275 X |
| 4,838,476 | 6/1989 | Rahn | 134/107 X |
| 4,841,645 | 6/1989 | Bettcher et al. | 34/27 X |
| 4,899,768 | 2/1990 | Yatabe | 134/107 X |

Primary Examiner—Henry A. Bennet
Assistant Examiner—Christopher B. Kilner
Attorney, Agent, or Firm—Hugh D. Jaeger

[57] ABSTRACT

Microprocessor controlled isopropyl alcohol vapor dryer system for robotic drying of wafer cassettes containing wafers or substrates. A wetted wafer or substrate is robotically placed into a virgin isopropyl alcohol vapor zone. The wetted surface and free-moving contaminants are replaced by a layer of isopropyl alcohol (IPA) which condenses on the surface. The dryer then robotically moves the IPA coated wafer or substrate into an upper cooling zone causing the isopropyl alcohol layer to flash off of the substrate surface, leaving the surface completely dry to a molecular level. IPA vapors are heated at the bottom of a quartz tank and maintained as a vapor by electric heating panels surrounding the quartz tank. A stainless steel cooling jacket surrounds the upper outer region of the quartz tank and between the quartz tank, and a stainless steel containment tank along with a cooling coil delineates a cooling zone about the upper region of the quartz tank where the IPA is flash-cooled from the surface of the substrate.

14 Claims, 22 Drawing Sheets

ISOPROPYL ALCOHOL VAPOR DRYER SYSTEM

BACKGROUND OF THE INVENTION

1. Field of the Invention

The present invention pertains to a semiconductor wafer or substrate vapor dryer, and more particularly, pertains to an isopropyl alcohol (IPA) vapor dryer with well defined and stable vapor and cooling zones.

2. Description of the Prior Art

Prior art IPA dryers have not advanced with other advances in state of the art front-end semiconductor fabrication processes. Prior art IPA vapor dryers have not always been utilized in automatic wet stations and could not be loaded from the top with a robot, such as a 2-axis robot. The feed methods and drain methods for the IPA were not state of the art. The prior art quartz tank was well fabricated and used stainless steel saucer trays providing further contamination, and the quartz tanks were not well coupled to the heater blocks. The prior art IPA vapor dryers minimized the number of heater rods providing an undistributed heating. Finally, the prior art IPA vapor dryers added particles.

The present invention overcomes the disadvantages of the prior art by providing an isopropyl alcohol vapor dryer system which is state of the art in front-end semiconductor processing and minimizes, and preferably negates, the addition of any particles.

SUMMARY OF THE INVENTION

The general purpose of the present invention is to provide an IPA vapor dryer system. The vapor dryer system includes distinct vapor and cooling zones where temperatures, and thus the gases or vapors, are kept and maintained at a more uniform and stable temperature for faster and higher quality vapor blanket recovery. The walls of the quartz tank are heated to discourage condensation from forming on the quartz walls and super heat the vapors. A barrier in the form of a cooling jacket dispenses between the upper outer region of the quartz tank and about the inner surfaces of a surrounding stainless steel containment tank, and further delineates the lower vapor zone from the upper cooling zone. The cooling zone contains interior cooling coils at and above the level of the exterior positioned cooling jacket.

According to one embodiment of the present invention, there is provided a quartz tank which is heated on the bottom side by an aluminum heating block. A sump tank (or quartz saucer) is located about the bottom of the quartz tank. A buffer cooling tank is located in the bottom of a panelled framework and beneath the liquid sump. The quartz tank includes a cooling coil in its top interior region and heating panels about its lower portions of the exterior vertical walls. The quartz tank, the cooling coil, the aluminum heating block, and the heating panels are surrounded by a stainless steel containment tank. A cooling jacket is disposed between the upper outer regions of the quartz tank and between the inner upper regions of the stainless steel containment tank, whereby a lower vapor zone and an upper cooling zone are defined. Robotically operated doors seal the interior of the vapor dryer. Drainage troughs and lip exhaust manifolds position about the regions above the doors to evacuate vapors and liquids from the door region.

One significant aspect and feature of the present invention is heated panels about a quartz tank of the IPA vapor dryer system.

Another significant aspect and feature of the present invention is a cooling jacket between a quartz tank and a stainless steel containment tank where distinct vapor and cooling zones are defined.

Further significant aspects and features of the present invention include an ample heated quartz tank, a lip exhaust manifold above the vapor dryer doors, a fire extinguisher port and ultraviolet fire detector beneath the vapor dryer doors, water-tight electrical connections, a stepper motor for actuation of the lift and lower column, microprocessor control, and nonturbulant interior air.

Additional significant aspects and features of the present invention include an all quartz saucer in the quartz tank.

Having thus described an embodiment of the present invention, it is the principal object hereof to provide a robotic IPA vapor dryer for the drying of substrates or wafers such as silicon wafers.

Objects of the present invention include an IPA vapor dryer system with a faster vapor blanket recovery, uniform vapor temperature, shorter process time and increased product throughput.

Another object of the present invention is an IPA vapor dryer system which maintains the IPA vapors in a stable, uniform temperature and vapor blanket. Further, the IPA vapors do not condense on the side walls of the quartz tank.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
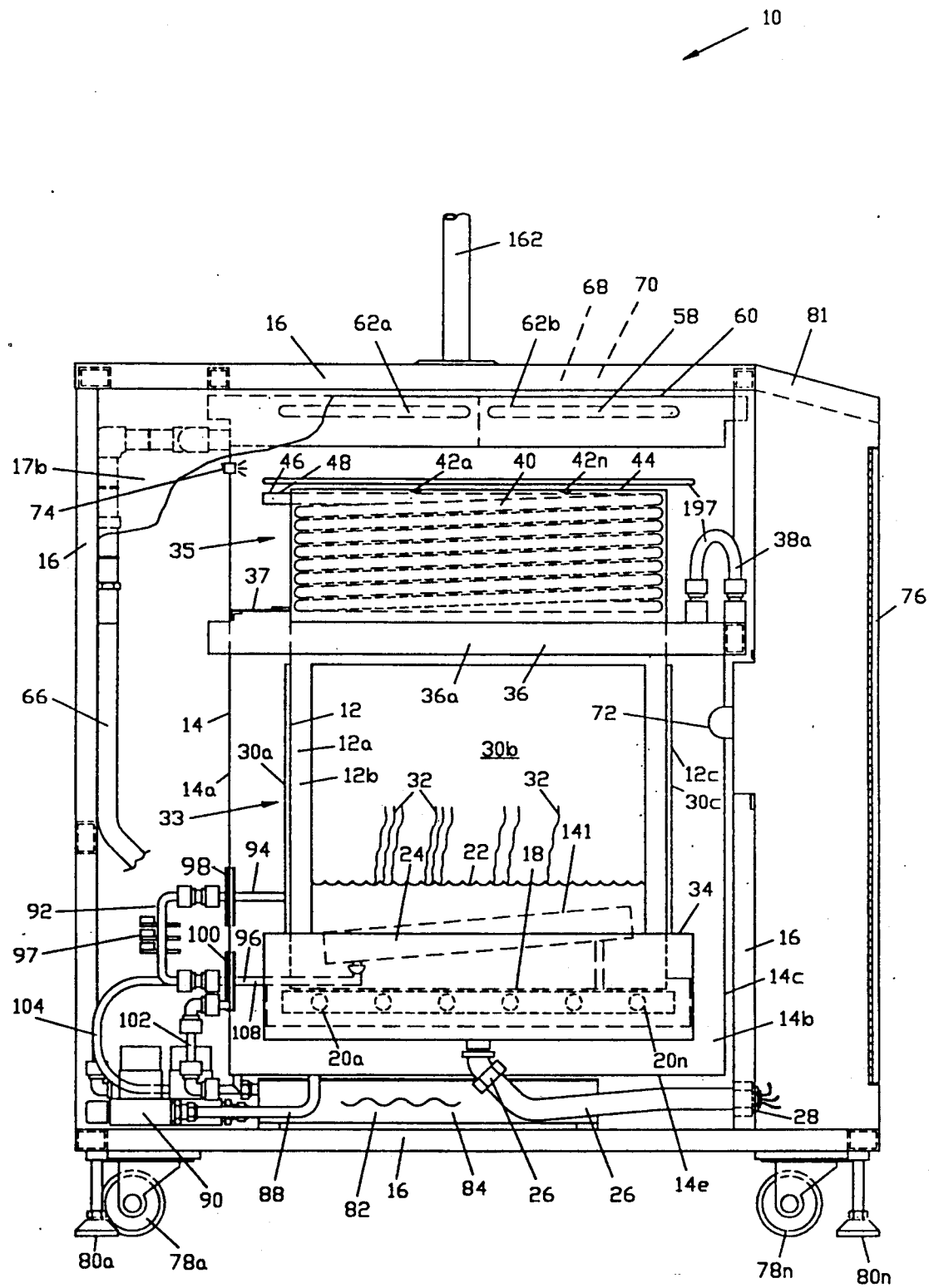
FIG. 1 illustrates a side view in cutaway of an isopropyl alcohol (IPA) vapor dryer system.

FIG. 1 illustrates a side view in cutaway of the main body of an isopropyl alcohol (IPA) vapor dryer 10 also known herein as a vapor dryer used for the drying of wafer cassettes containing substrates or wafers. Reference numbers can be found in the reference figure, as well as in the accompany figures.

Figure 4:
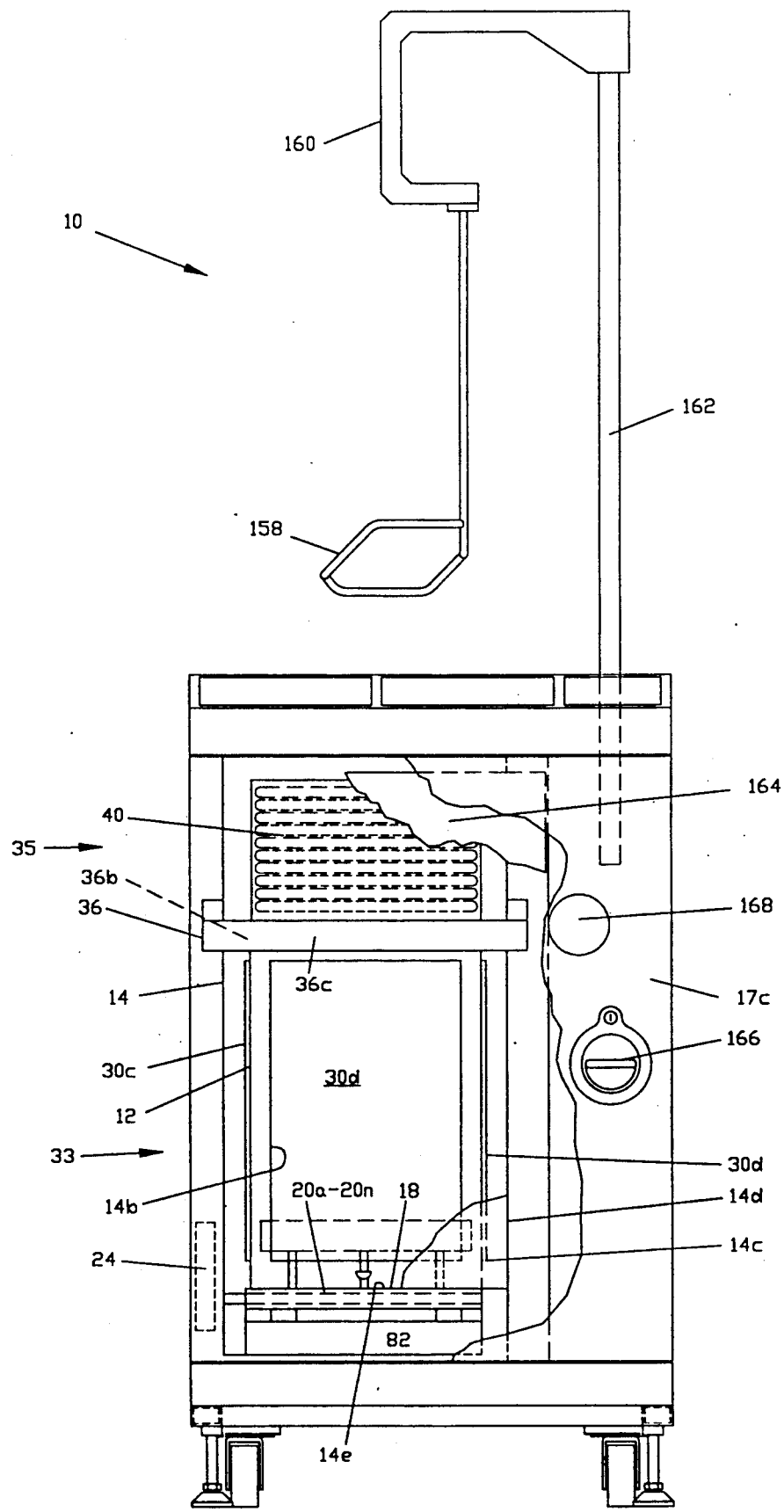
FIG. 4 illustrates a side view in cutaway of the vapor dryer system.

FIG. 1 discloses an open top quartz tank 12 including side walls 12a-12d centrally located in a stainless steel containment tank 14 which is suspended from a surrounding paneled framework system 16 that encompasses the quartz tank 12, the stainless steel containment tank 14 and the other components. The quartz tank 12 used, which comes in contact with the IPA, is the highest purity optical grade quartz material available to prevent leaching of the material into the process chamber. The finish of the quartz tank 12 is a fire polished finish which prevents the manufacturer from covering defects by sandblasting. The smooth finish also helps prevent particle buildup on the side walls which can occur if the quartz finish is not smooth like window glass. The quartz tank 12 can be easily accessed and removed for cleaning. The stainless steel containment tank 14 includes sides 14a-14d and a bottom 14e as illustrated in several of the following figures of the vapor dryer 10. Panels 17a-17d secure about the framework system 16. An aluminum heating block 18 is suspended and secured between the walls of the stainless steel containment tank 14 as also illustrated in FIG. 4. The aluminum heating block 18 includes a plurality of electric heating rods 20a-20n extending horizontally through the aluminum heating block 18 to heat isopropyl alcohol 22 in the lower portion of the quartz tank 12. The electric heating rods 20a-20n provide 1500 watts of heating which is sufficient and important for stable and even heating to produce the proper recovery density and height of the vapor blanket. A water tight electrical cover box 24 secures over the connection ends of the plurality of electric heating rods 20a-20n. A water tight nut 26 secures to the water tight electrical cover box 24 by a water tight nut 26. The opposing end of the conduit secures to the framework system 16 panel by a water tight nut 28 to complete a sealed water proof electrical connection arrangement for safe water proof connection of the electric heating rods 20a-20n to an external electrical supply. Another independent heating supply is used for the plurality of electrical heating panels 30a-30n including electrical heating panels 30a-30d secure to the outer surfaces of the quartz tank 12 to further heat the quartz tank 12 and the isopropyl alcohol 22 within to further assist in the formation of isopropyl alcohol (IPA) vapor 32.

Figure 2:
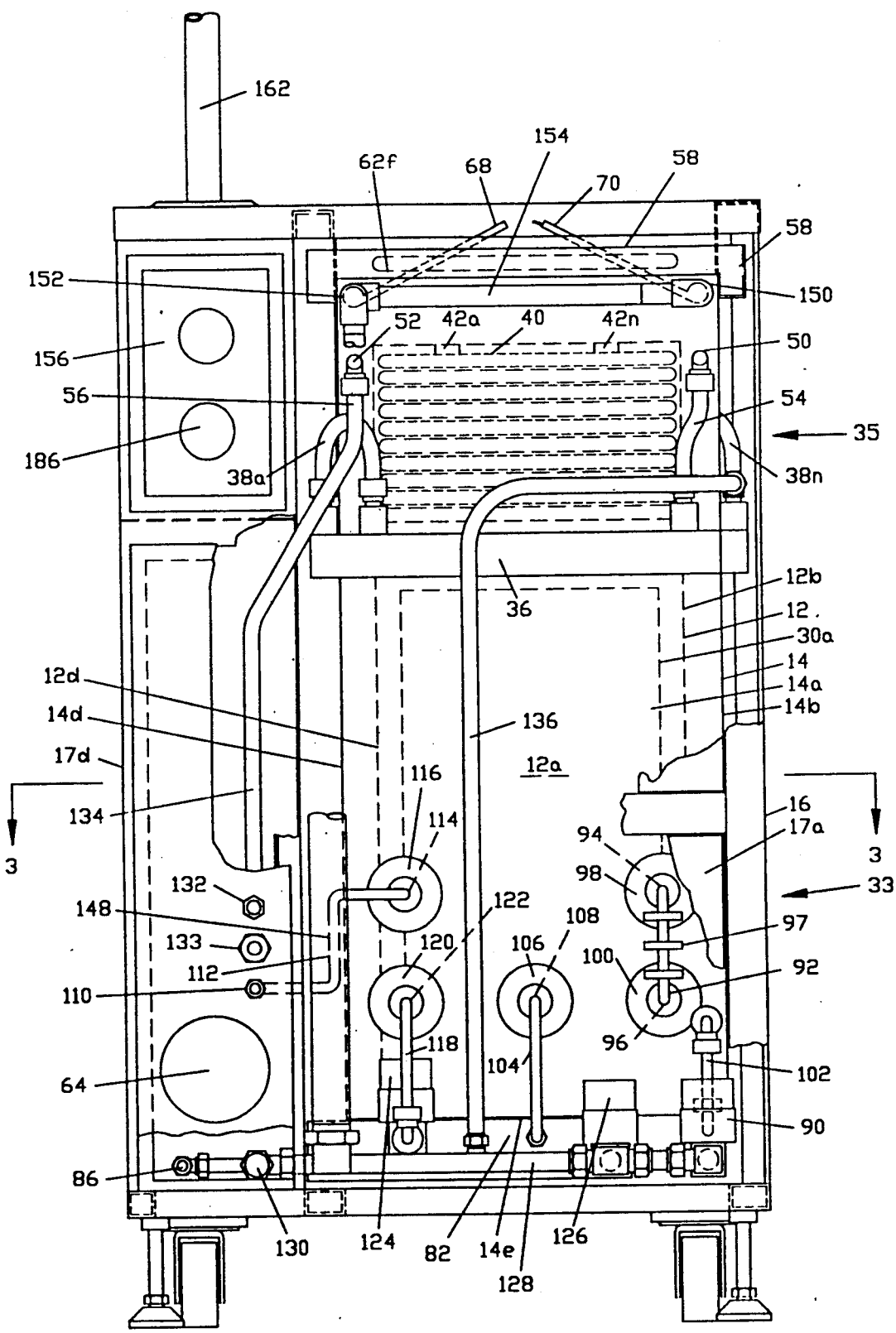
FIG. 2 illustrates a left side cutaway view of the an isopropyl vapor dryer system.

To this point as described, the heating of the IPA in the lower two thirds of the quartz tank 12 has been briefly described and is known as the vapor zone. Cooling of the IPA vapor 32 in the upper one third of the quartz tank 12 is desirable to return the IPA vapor to a liquid state so that it may free fall to the liquid sump 34 in the lower region of the quartz tank 12 to be reheated for subsequent return to a vapor form. The upper third region of the quartz tank 12 along with its associated components is known as the cooling zone 35. The quartz saucer tray 141, FIG. 7, in quartz tank 12, collects and gravity drains any contaminants which have condensed on the cassettes, robotic basket and substrates. Cooling of the upper portion of the stainless steel containment tank 14 surrounding the upper portion of the quartz tank 12 is accomplished by a four sided stainless steel cooling jacket 36, of which side 36a is illustrated in this figure, lying against the outer surface of the stainless steel tank 14. Cooling of the stainless steel containment tank 14 assists in cooling of the upper portion of the quartz tank 12 and surrounding region. The stainless steel cooling jacket 36 creates a controlled environment in the upper regions for drying processes to function without causing excessive heat buildup of air currents generated from the heat mass of the electric heating panels 30a-30d and aluminum heating block 18. A plurality of connection tubes 38a-38n, of which 38a is illustrated in this figure, connect the tubes 36a-36n in series. Other connection tubes of the tube plurality 38a-38n are illustrated in the accompanying figures. An air flow damper 37 attached to the stainless steel tank 14 aligns in the space between the wall 14a of the stainless steel containment tank 14 and wall 12a of the quartz tank 12. Also a quartz cooling coil 40, through which cooling water is passed, aligns within the upper approximate one third region, or cooling zone 35, of the quartz tank 12 to condense isopropyl alcohol vapors in cooling the upper region of the quartz tank 12. The quartz cooling coil 40 includes a plurality of hook like brackets 42a-42n which capture over and about the rectangular lip 44 of the quartz tank 12. The quartz cooling coil 40 also includes a quartz tube outlet 46 and a quartz tube inlet 48 which attach to flex hoses 50 and 52 and cooling water outlet pipe 54 and a cooling water inlet pipe 56, respectively as illustrated in FIG. 2. A four-sided nitrogen manifold 197 surrounds the extreme upper region of the quartz tank and is located between tank 40 and the lip exhaust manifold 58. The purpose is to maintain a nitrogen enriched environment within the above-mentioned region. A four-sided lip exhaust manifold 58 surrounds the extreme upper region of the stainless steel containment tank 14 and adjacent to the lip 60. The lip exhaust manifold 58 also seals over and about a plurality of slotted holes 62a-62f which align horizontally in close proximity to the containment lip 60. The lip exhaust manifold 58 is negatively pressurized to draw off vapor particles which are above the top of the quartz cooling coil 40 and routes them to an exhaust duct 64 of FIG. 2. The lip exhaust manifold 58 is segmented to draw vapors from the entire lip area and reduce turbulence as described in detail in FIG. 5. A drain line 66 connects to the door drains for doors 68 and 70 as illustrated in FIG. 2. An ultraviolet light sensor 72 secures through the side 14c of the stainless steel containment tank 14 to sense a fire in the stainless steel containment tank 14. A fire extinguisher port 74 connects to an external extinguishing device mounted in side wall 14a of the stainless steel containment tank 14 to provide extinguisher protection for the vapor dryer 10. All detection probes and discharge ports are located below the vapor tank doors 68 and 70. This is important for immediate detection and suppression of any unsafe condition, as per Factory Mutual, in the IPA vapor tank if the door (lid) was closed. The vapor dryer 10 also includes a front access panel 76, a plurality of wheels 78a-78n, a plurality of adjustable feet 80a-80n secured to the bottom of the framework system 16, and an operator control panel 81.

A buffer cooling tank 82 is located beneath the stainless steel containment tank 14 and includes a coil 84 through which cooling water flows from the stainless steel cooling jacket 36 and the quartz cooling coil 40 and overboard through an IPA cooling water outlet 86 of FIG. 2. An emergency drain line 88 secures between the bottom 14e of the stainless steel containment tank 14 and a emergency drain solenoid valve 90 for drainage of effluence should breakage of any component within the stainless steel containment tank 14 occur. A quartz tank level sight glass 92 with appropriate connectors and tubing secures to the horizontal tubular extensions 94 and 96 from side 12a of the quartz tank 12. A photo-optical sensor array 97 aligns with the sight glass 92 to sense the quartz tank 12 IPA level. The sensor array 97 does not come in physical contact with the IPA liquid. The tubular extensions extend through neoprene seals 98 and 100. A stainless steel containment tank level sight glass 102 with appropriate connectors and tubing connects between the side 14a and the bottom 14e.

Inputted IPA liquid is exposed only to Teflon and quartz after filtration to 0.1 micron to prevent chemical and particle contamination. The liquid detection is accomplished externally by photo-optical sensor array 97 and quartz sight glass 92 instead of pressure differential level sensors, which introduce contamination which need to be replaced frequently since the IPA liquid temperature is approximately 82° C.

Figure 3:
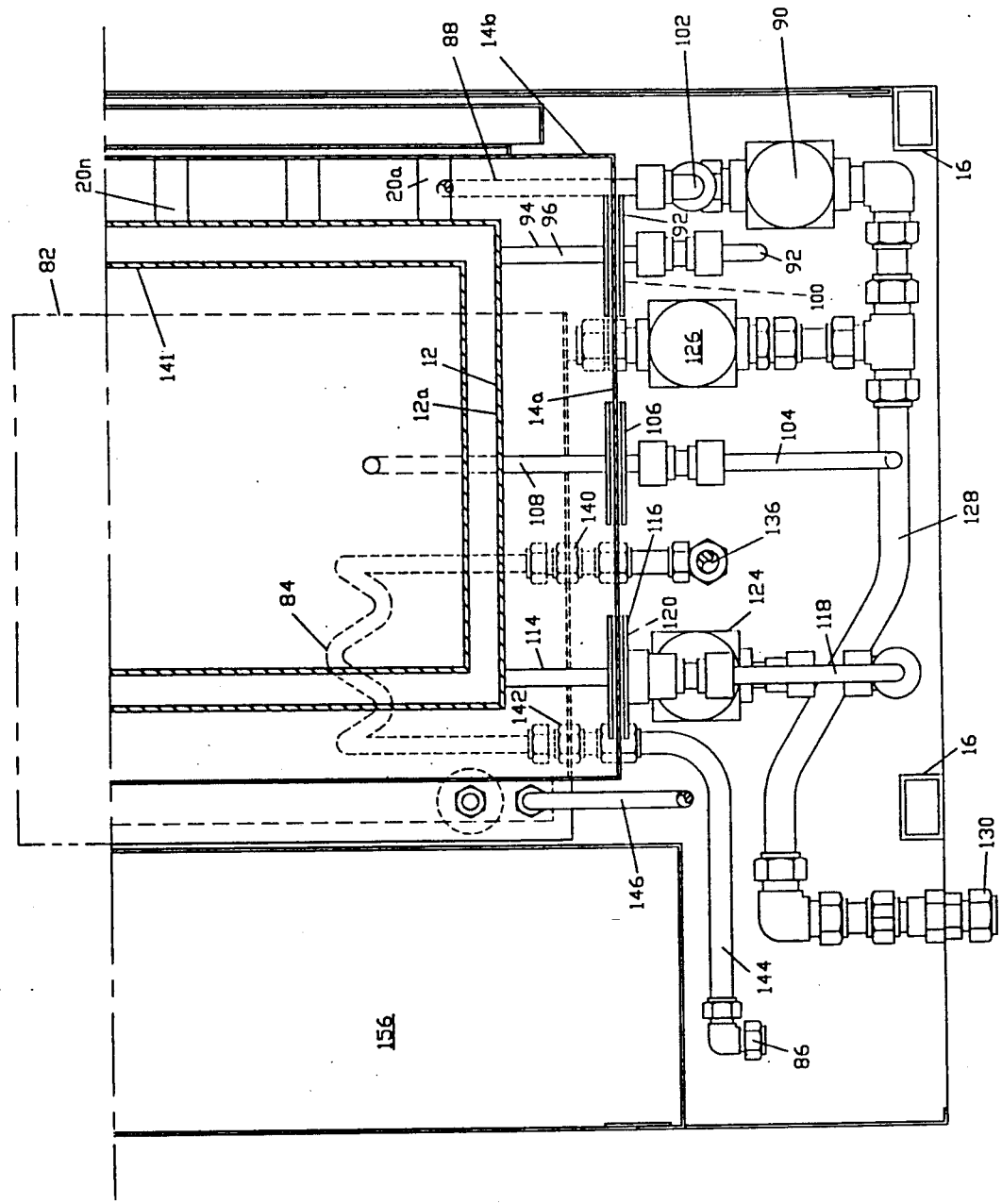
FIG. 3 illustrates a top view in cross section along line 3—3 of FIG. 2.
Figure 7:
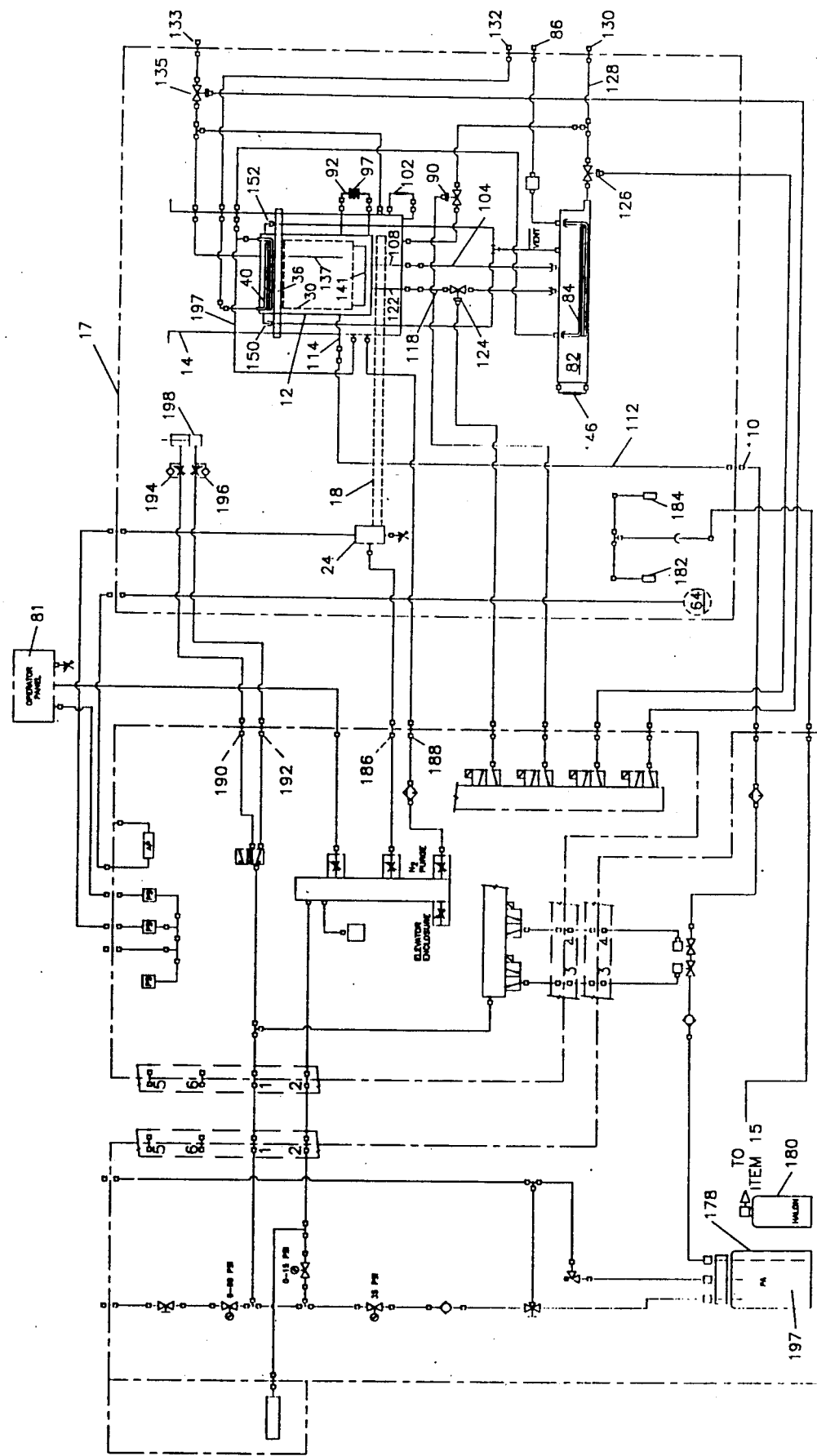
FIG. 7 illustrates a schematic diagram of the vapor dryer system.

FIG. 2 illustrates a left side cutaway view of the vapor dryer 10 where all numerals correspond to those elements previously described. Illustrated in particular in this Figure and FIGS. 1 and 3 is the piping arrangement for the viscous input and output for the vapor dryer 10. A saucer tray drain tube 104 with appropriate connectors connects on the upper end through a neoprene seal 106 to a tubular extension 108 extending from the quartz saucer tray 141 of FIGS. 7, 20 and 21, and also from and through the bottom of the quartz tank 12 and on the lower end to the buffer cooling tank 82 as also illustrated in FIGS. 1, 3 and 7. The quartz saucer tray 141 if of high purity optical grade quartz with a ground and polished finish. A vapor tank filler port 110 for the introduction of isopropyl alcohol into the quartz tank 12 connects by a pipe 112 to another tubular extension 114 extending from side 12a of the quartz tank 12 through a neoprene seal 116 in the side 14a of the stainless steel containment tank 14. A quartz tank drain tube 118 with appropriate connectors extends on the top through a neoprene seal 120 and connects to a tubular extension 122 extending from side 12a of the quartz tank 12 and extends on the bottom to a deionized water dump solenoid valve 124. The solenoid valve 124 is connected to the buffer tank 82. A buffer tank waste solenoid valve 126 connects on one end to the buffer tank 82 and on the other end to an IPA drain line 128. Both the buffer tank waste solenoid valve 126 and the emergency drain solenoid valve 90 are connected to the IPA drain line 128 and terminate at an IPA drain line outlet 130.

Deionized water enters through a port 133 and connects to a solenoid valve 135 as illustrated in FIG. 7. The deionized water is injected by a pipe 137 above the quartz saucer 141.

Cooling water flows through the quartz cooling coil 40 via cooling water which enters through a cooling water inlet port 132 and proceeds through a pipe 134, flex hose 52, to the quartz cooling coil 40. The cooling water then proceeds into, through and within the stainless steel cooling jacket 36 from the quartz cooling coil 40 through the flex hose 50, the outlet pipe 54 and into the stainless steel cooling jacket inlet to cool the upper portion of the stainless steel containment tank 14. Cooling water exits the stainless steel containment tank 14 through a pipe 136 which is plumbed to the output end stainless steel cooling jacket on one end and is terminated at a buffer tank through connector assembly 140 on the opposing end as illustrated in FIG. 3. The cooling water then flows through the buffer coil 84 which connects between the through connector assembly 140 and another buffer tank through connector assembly 142 and through a pipe 144 and the cooling water outlet 86 illustrated in FIG. 3. A buffer tank level sight gauge 146 is illustrated in FIG. 3 for determining fluid level in the buffer tank. A vertically aligned vapor concentration monitor conduit 148 is located in framework system 16 and panels 17a-17d and samples the LEL% beneath the doors 68 and 70. The vapor concentration monitor conduit 148 connects to a vapor concentration monitor to monitor the LEL%.

Doors 68 and 70 are pneumatically actuated and are angled downwardly from their mutual edge meeting point to drain effluence into a plurality of troughs including troughs 150 and 152 which are plumbed to the exhaust duct 64. A water and air tight electrical connection box 156 is located in the upper left hand corner of the cabinetry.

FIG. 3 illustrates a cross section top view along line 3—3 of FIG. 2 illustrating the lower portion of the vapor dryer 10 where all numerals correspond to those elements previously described.

FIG. 4 illustrates side in cross section of the vapor dryer 10 where all numerals correspond to those elements previously described. Illustrated in particular is the product carrier 158 in which cassettes and substrates are elevated into the quartz tank 12 of the vapor dryer 10. The product carrier 158 is stainless steel electroplated and is Teflon coated and secures to a configured bracket 160 atop a mechanically operated lift/lower column 162. The product carrier can carry up to 8" wafers. An electrical component panel 164 is located behind panel 17c. Panel 17c also includes a door handle 166. A stepper motor 168 drives the lift/lower column 162 vertically. The stepper motor 168 guarantees process control repeatability because of the accuracy in positioning the cassette in the vapor zone, cool zone and load/unlaod position. Particle addition and streaks on the water are eliminated as problems because of smooth speed control adjustable from 0.1 millimeters per second and greater. If movement through the vapor zone or cool zone is jerky or too fast, particles and streaks will exist. The accuracy in returning the robot to the load/unload position is extremely critical to prevent particle addition from a rough or at worst unsuccessful robotic interface between the vapor dryer 10 and chemical cleaning station which can only be accomplished by using a stepper motor.

Figure 5:
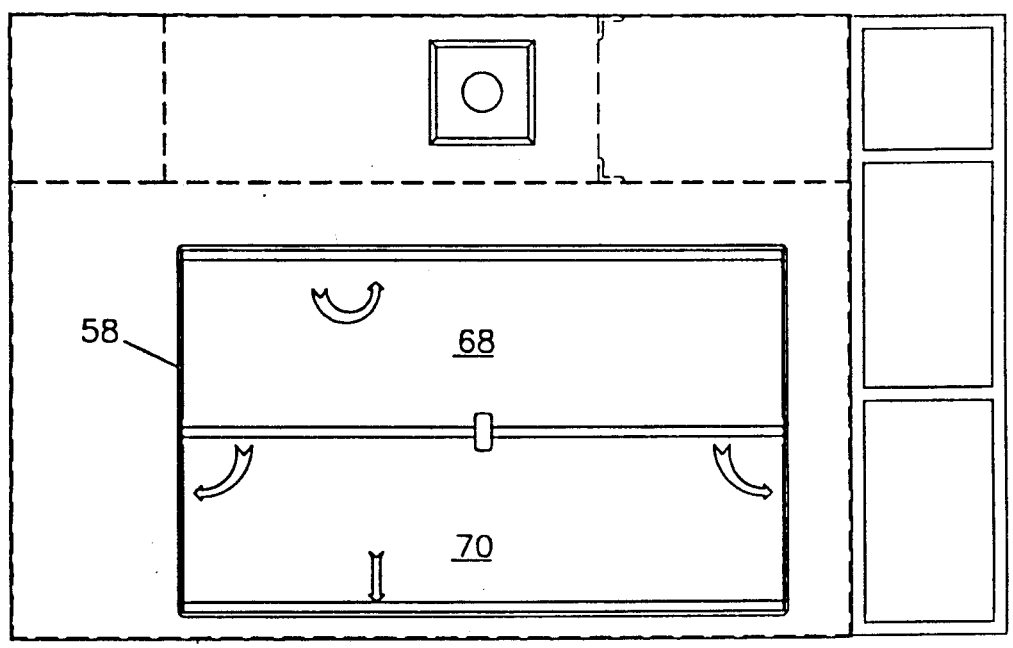
FIG. 5 illustrates a top view of the vapor dryer system.

FIG. 5 illustrates a top view of the vapor dryer 10 with the lift/lower column 162, product carrier 158 and bracket 160 removed for clarity and brevity of illustration. All other numerals correspond to those elements previously described. Illustrated in particular are the doors 68 and 70.

Figure 6:
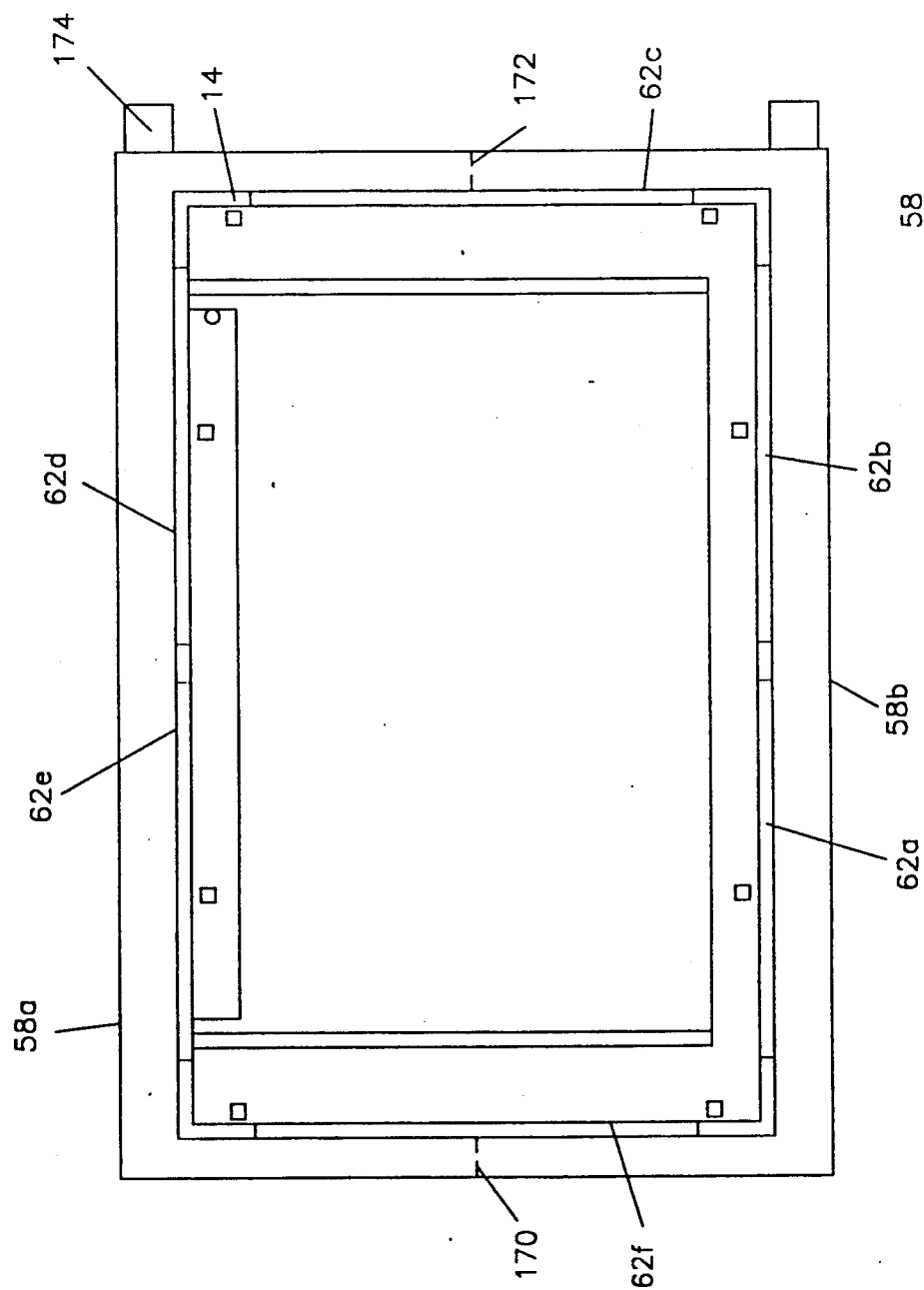
FIG. 6 illustrates a top view of the lip exhaust manifold.

FIG. 6 illustrates a top view of the lip exhaust manifold 58 surrounding the stainless steel containment tank 14. Slotted holes 62a-62f in the upper portion of the stainless steel containment tank 14 are illustrated. The lip exhaust manifold 58 is secured over and about the slotted holes 62a-62f as previously described. It is noted that baffles are integral to the interior chamber of the lip exhaust manifold 58 effectively dividing the lip exhaust into two halves 58a and 58b. In the illustration, half 58a is in the form of an inverted "U" and draws vapors through one half of slotted hole 62f and 62c and vapors through all of the slotted holes 62e and 62d. The vapors exit through the port 174. Half 58b is a mirror image of half 58a and draws vapors through one half of the slotted holes 62f and 62c and vapors through all of the slotted holes 62a and 62b. The vapors exit the port 176. Vapors can be drawn equally through the ports 174 and 176 via halves 58a and 58b or one side such as half 58a may be drawn off with more rapidity than half 58b or vice versa to meet certain air flow requirements.

FIG. 7 illustrates a schematic diagram of the vapor dryer 10 where all numerals correspond to those elements previously described. Also included in the Figure is a pressurized and filtered IPA source container 178 that delivers IPA to the IPA filler port 110. A Halon extinguisher 180 connects to Halon heads 182 and 184 within the panels 17a-17d. AC current to power the aluminum heating block 18 is delivered through port 186 on the water-tight electrical box 156 illustrated in FIG. 2. $Gn_2$ purge is delivered through port 188 and is ported to the stainless steel containment tank 14. Pneumatic air is connected to ports 190 and 192 and is delivered through pneumatic valves 194 and 196 to power a pneumatic cylinder 198 to operate the doors 68 and 70.

The IPA cabinet including the plurality of panels 17a-17d serves several purposes such as $CO_2$ containment, IPA bulk containment and electrical containment of components which generate heat or exceed one hundred volts, such as power supplies or main contact breakers. The $CO_2$ or Halon extinguisher 180 required for the IPA dryer is 35 lbs. with dimensions of 10" round at a height of 46" including the electrical discharge head. Since maximum deck height on most chemical clean stations is between 36 and 42 inches, it is not feasible to install the $CO_2$ bottle in the vapor dryer. The bulk feed IPA source container 178 is a 5 to 25 gallon 316 stainless steel electropolished DOT canister. The purpose is to insure that the IPA is contained in a canister that is noncombustible and federally approved. A plastic canister is not approved for dispensing IPA. The second function of the IPA source container 178 is to prevent excessive operator handling and monitoring of the IPA feed container. The 5 gallon container will last approximately 3 days depending on production throughput. The IPA is $N_2$ pressure filtered to 0.05 micron at 0.2 PSI. The IPA source container is DOT Federally approved pressure rated for 200 PSI with a check valve. An IPA bulkfeed empty nitrogen manifold 197 is located in IPA source container 178. This prevents air buildup in the IPA feed line which would disturb the vapor blanket when entering the IPA vapor quartz tank 12. Finally, the electrical box 156 is used solely for the purpose of removing heat generating high voltage components. This section is the top compartment of the dryer and can be removed and placed inside the chemical clean station if required.

Figure 8:
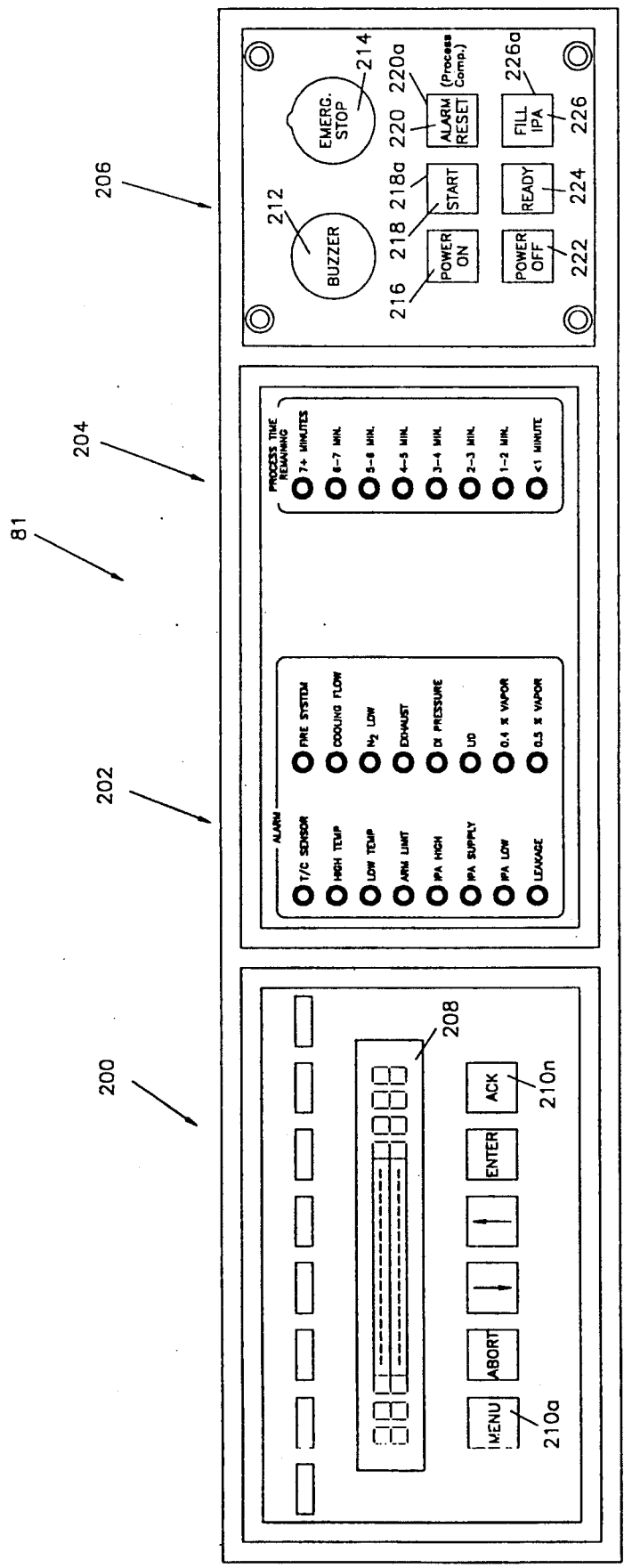
FIG. 8 illustrates the control panel of the vapor dryer system.

FIG. 8 illustrates the control panel 81 including a microprocessor panel 200, an alarm annunciator panel 202, a process time annunciator panel 204 and a general control panel 206. The interactive microprocessor panel 200 is used to initiate all functions, as well as to set the vapor dryer operating parameters. The microprocessor panel 200 includes an LCD alphanumeric readout 208 and a plurality of control switches 210a-210n. The microprocessor 200 controls almost every facet of the dryer operation including, but not limited to, fluid levels, flow rates, temperatures, IPA concentration percentage of LEL and fire control and alarm. The microprocessor also drives the alarm annunciator panel 202 and the process time annunciator 204. The general control panel 206 includes an audible alarm buzzer 212, an emergency stop switch (EMO) 214, a power on switch 216, a combination start switch 218 and indicator light 218a, an alarm reset switch and process complete 220 and indicator light 220a, a power off switch 222, a ready light 224 and a combination fill IPA switch 226 and lights 226a.

Figure 9:
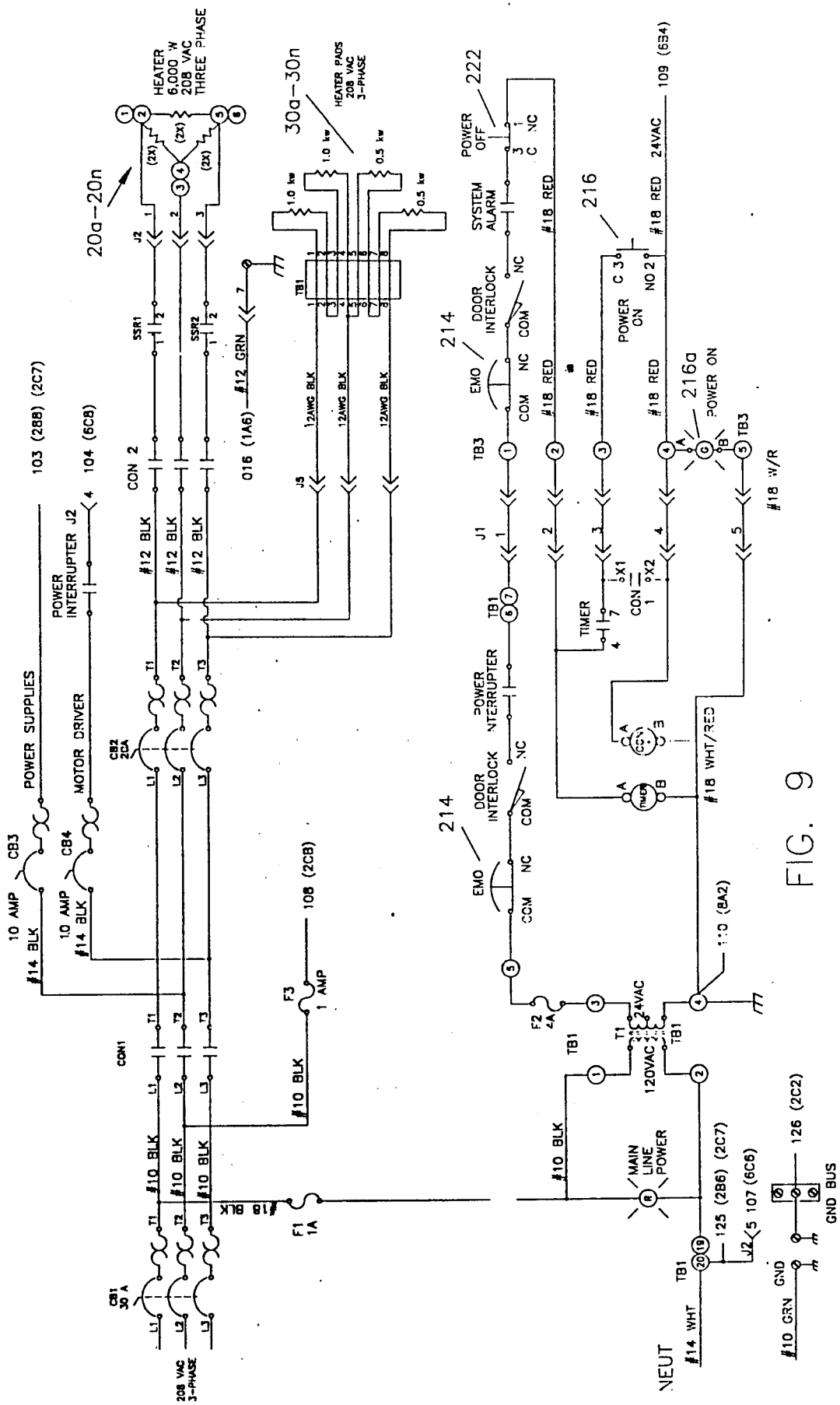
FIG. 9 illustrates a schematic diagram of the heater wiring and control wiring for the vapor dryer system.

FIG. 9 illustrates a schematic diagram of the heater wiring and control where all numerals correspond to those elements previously described.

Figure 10:
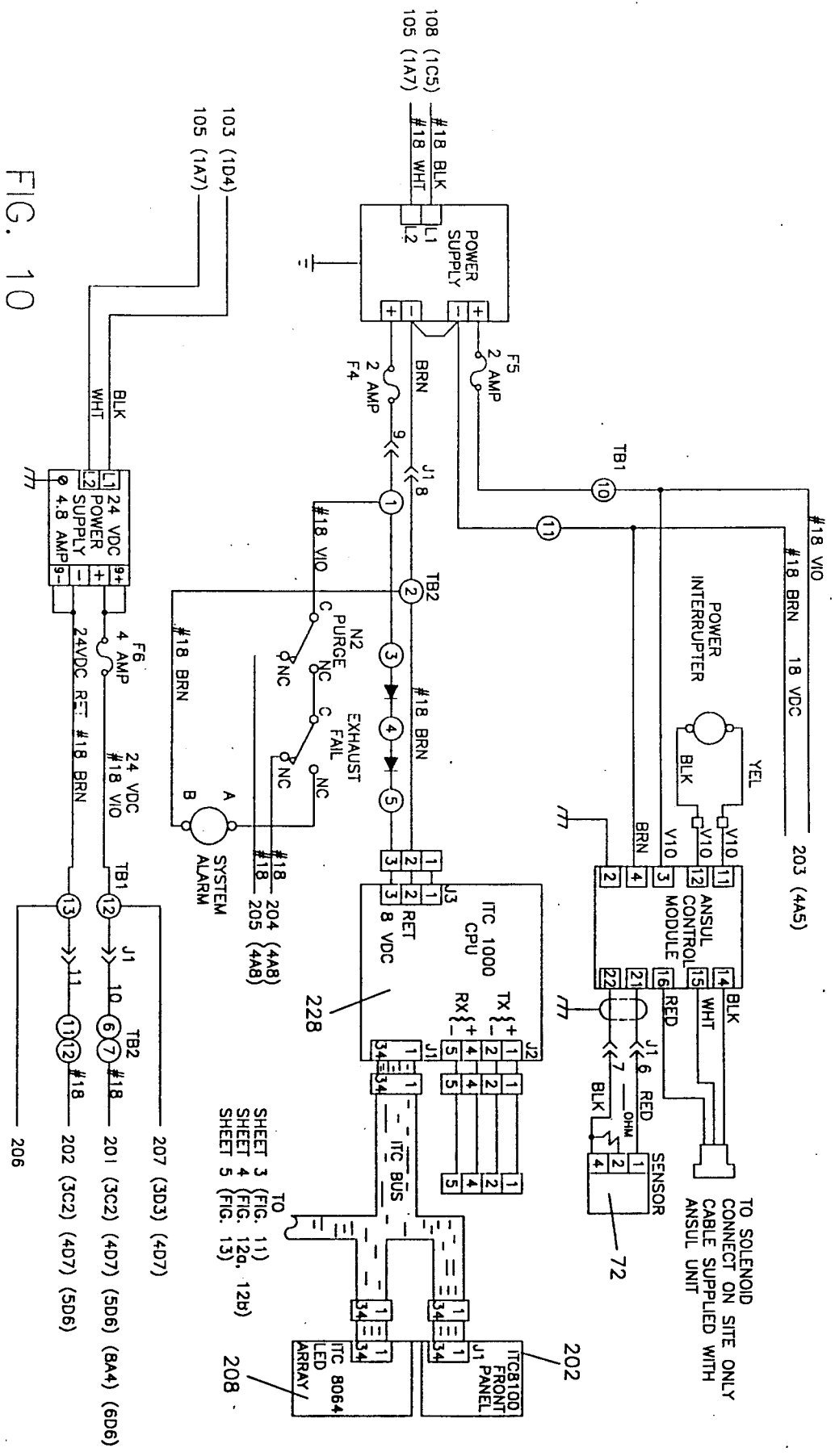
FIG. 10 illustrates a schematic diagram of power supply sources, CPU to panel buses and fire control for the vapor dryer system.

FIG. 10 illustrates a schematic diagram of power supply sources, a CPU 228, CPU to operator panel 81, buses and fine control where all numerals correspond to those elements previously described.

Figure 11:
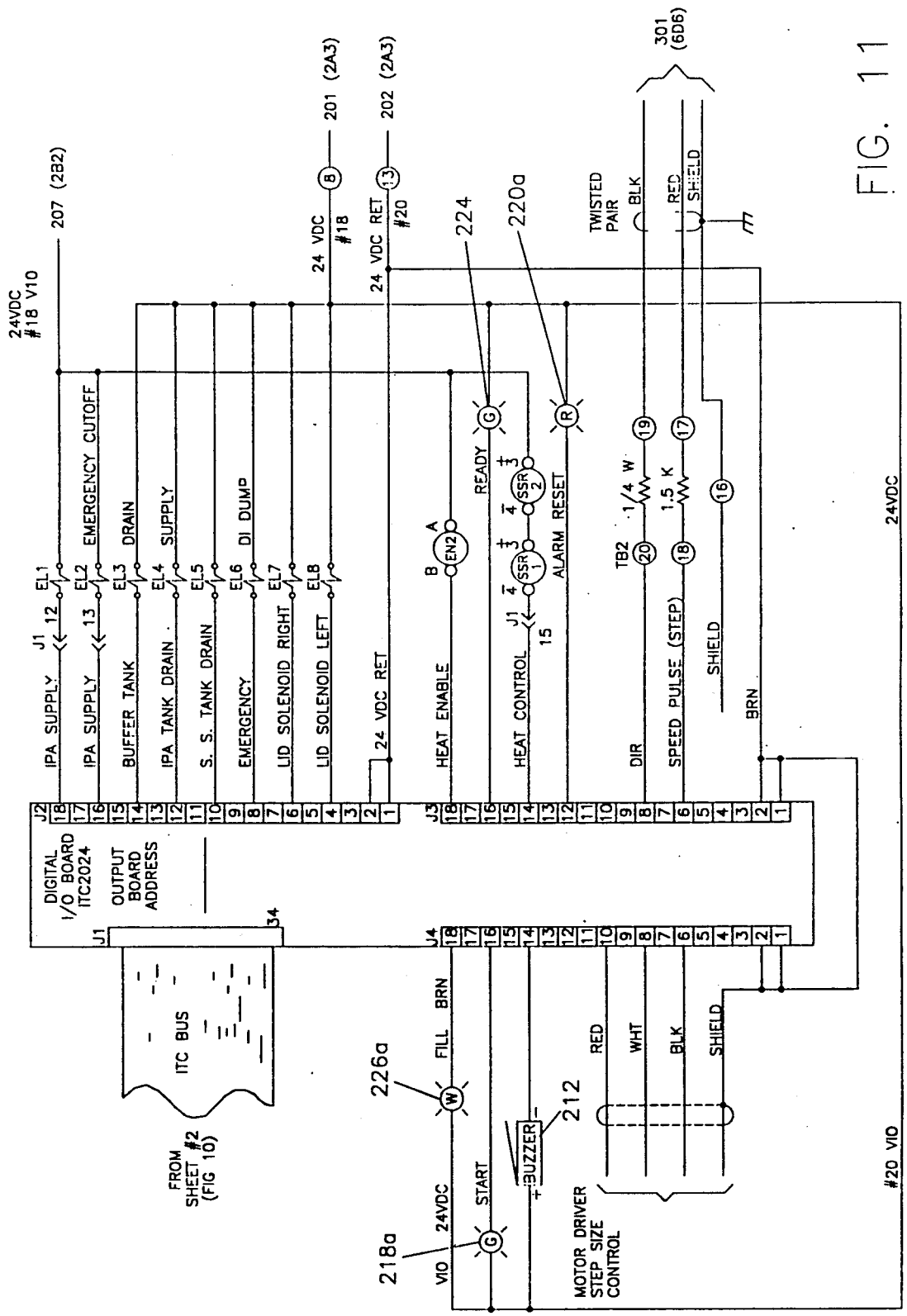
FIG. 11 illustrates a schematic diagram of the digital I/O board and connections thereto for the vapor dryer system.

FIG. 11 illustrates a schematic diagram of the digital I/O board and connections thereto where all numerals correspond to those elements previously described.

Figure 12A:
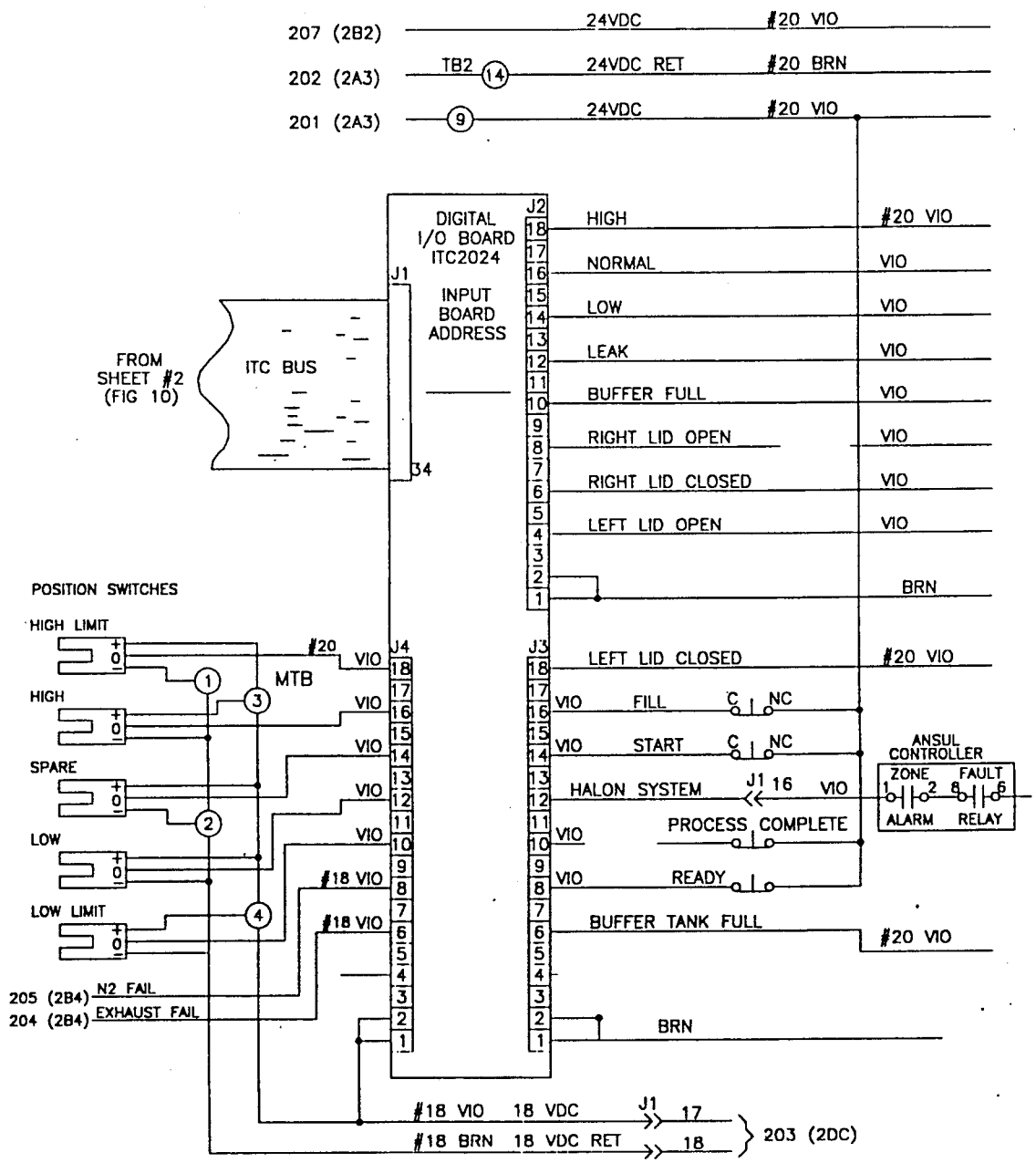
FIGS. 12A and 12B illustrate a schematic diagram of digital I/O board and connections thereto for the vapor dryer system.
Figure 12B:
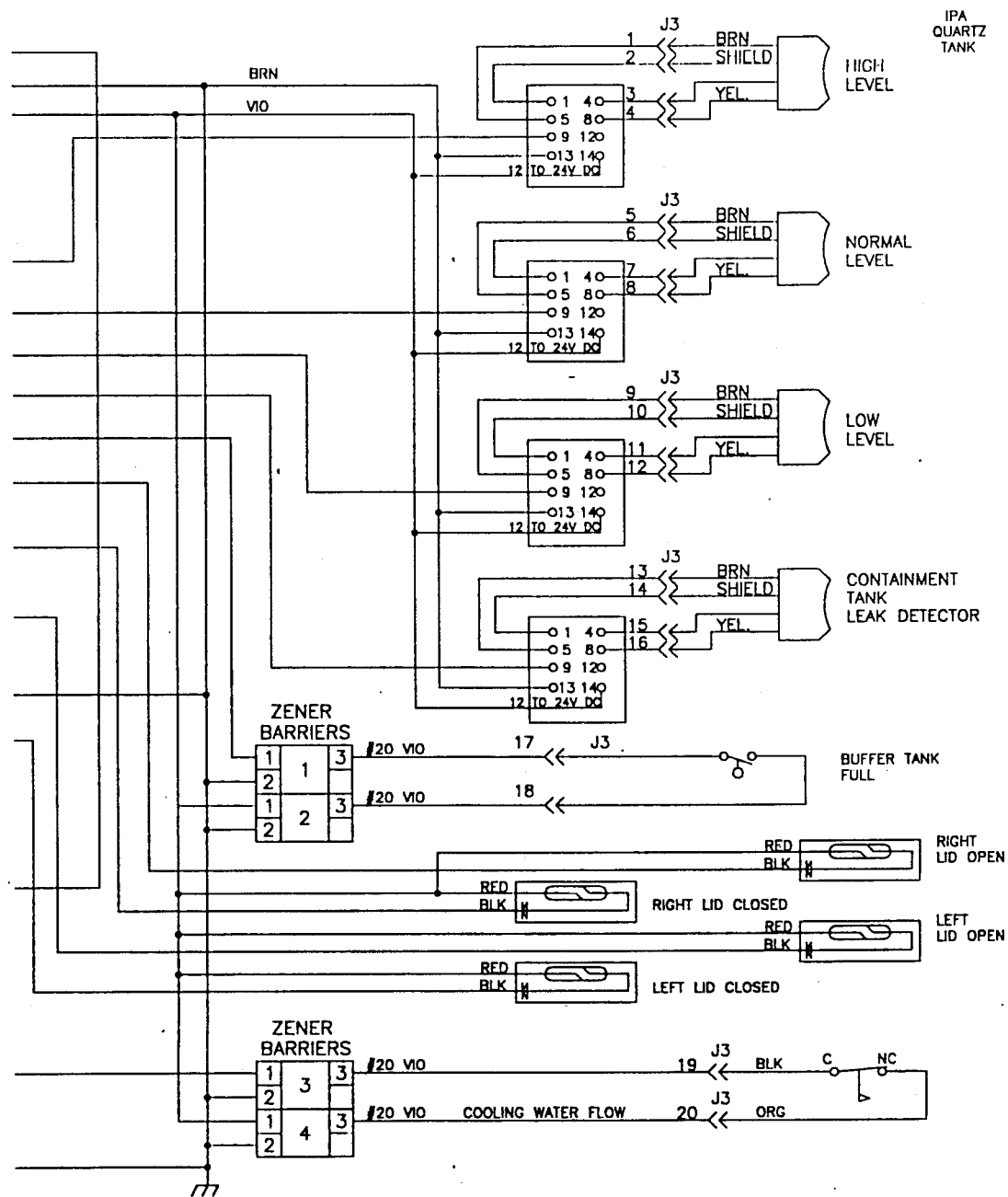

FIGS. 12A and 12B illustrate a schematic diagram of a digital I/O board and connections thereto where all numerals correspond to those elements previously described.

Figure 13:
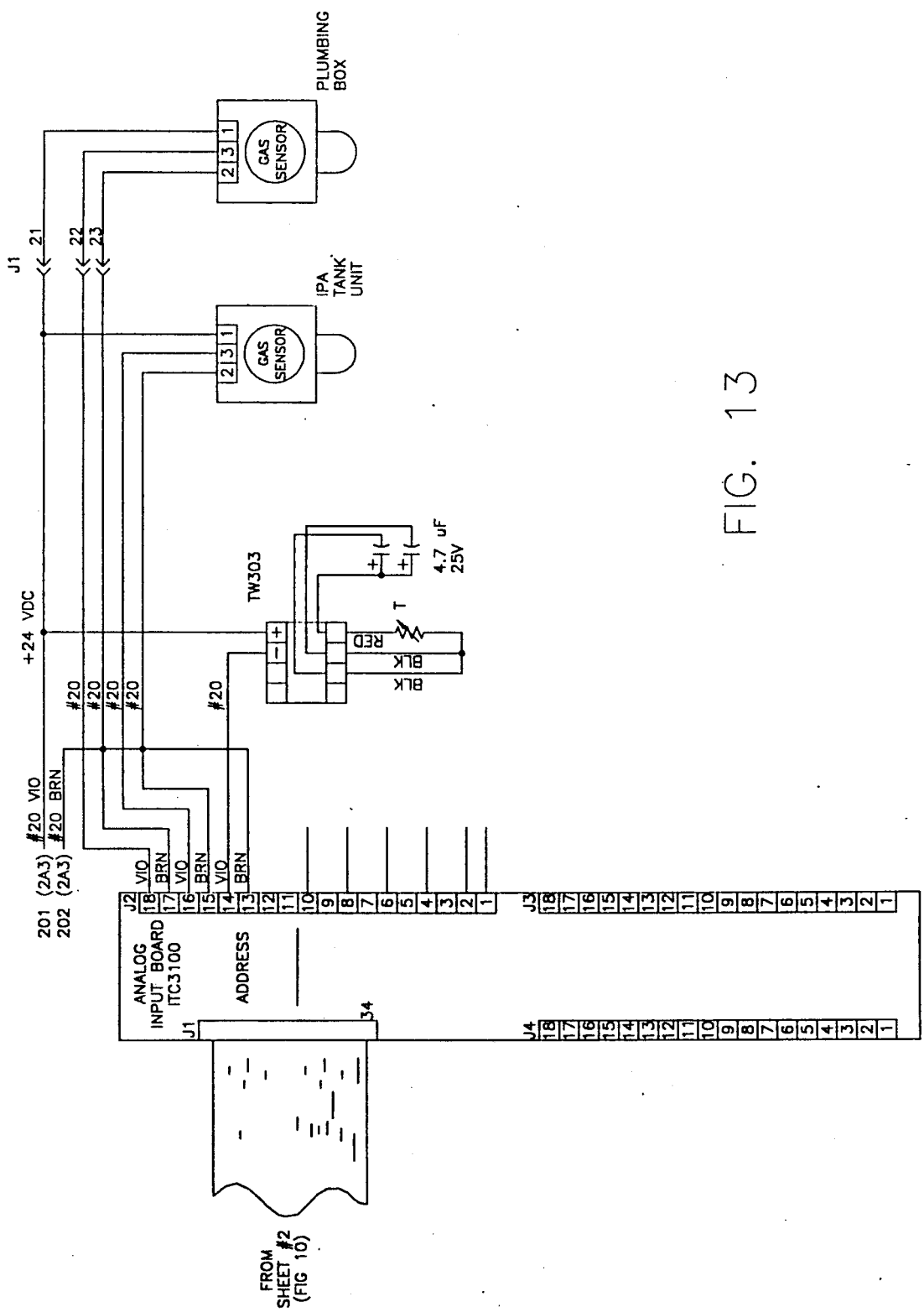
FIG. 13 illustrates a schematic diagram of an analog input board and gas sensors.

FIG. 13 illustrates a schematic diagram of an analog input board and gas sensors where all numerals correspond to those elements previously described.

Figure 14:
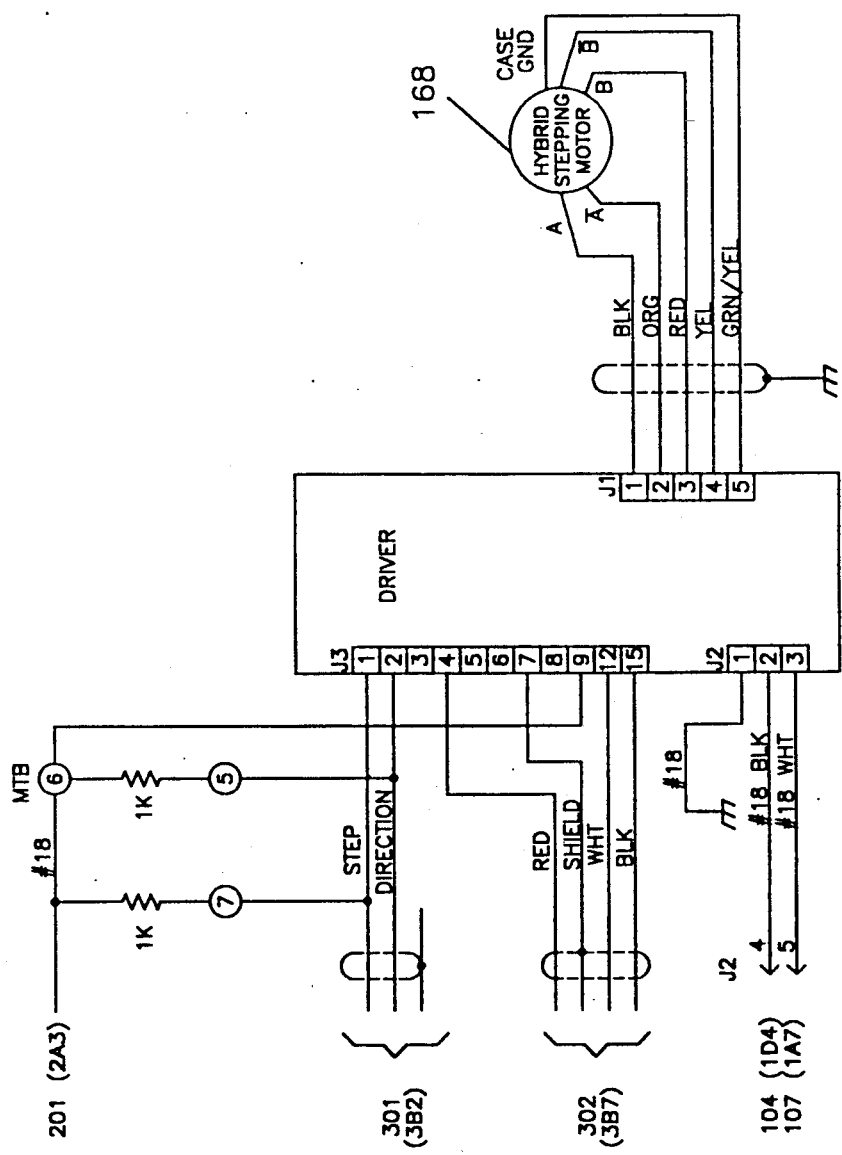
FIG. 14 illustrates a schematic diagram of the stepping motor and the driver.

FIG. 14 illustrates a schematic diagram of the stepper motor 168 and its driver where all numerals correspond to those elements previously described.

Figure 15:
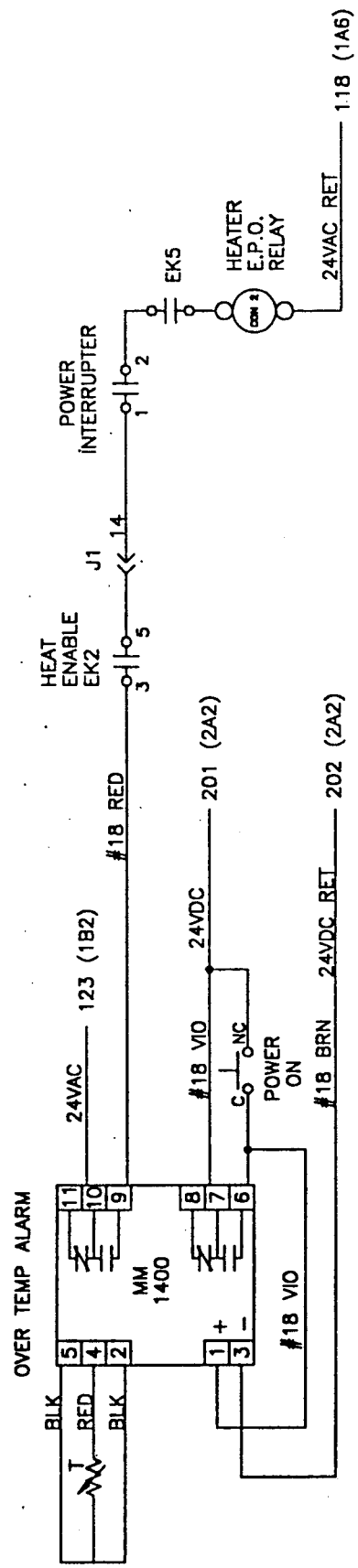
FIG. 15 illustrates a schematic diagram of an over temperature alarm for the electric heating rods.

FIG. 15 illustrates a schematic diagram of an over temperature alarm for the electric heating rods 20a-20n where all numerals correspond to those elements previously described.

Figure 16:
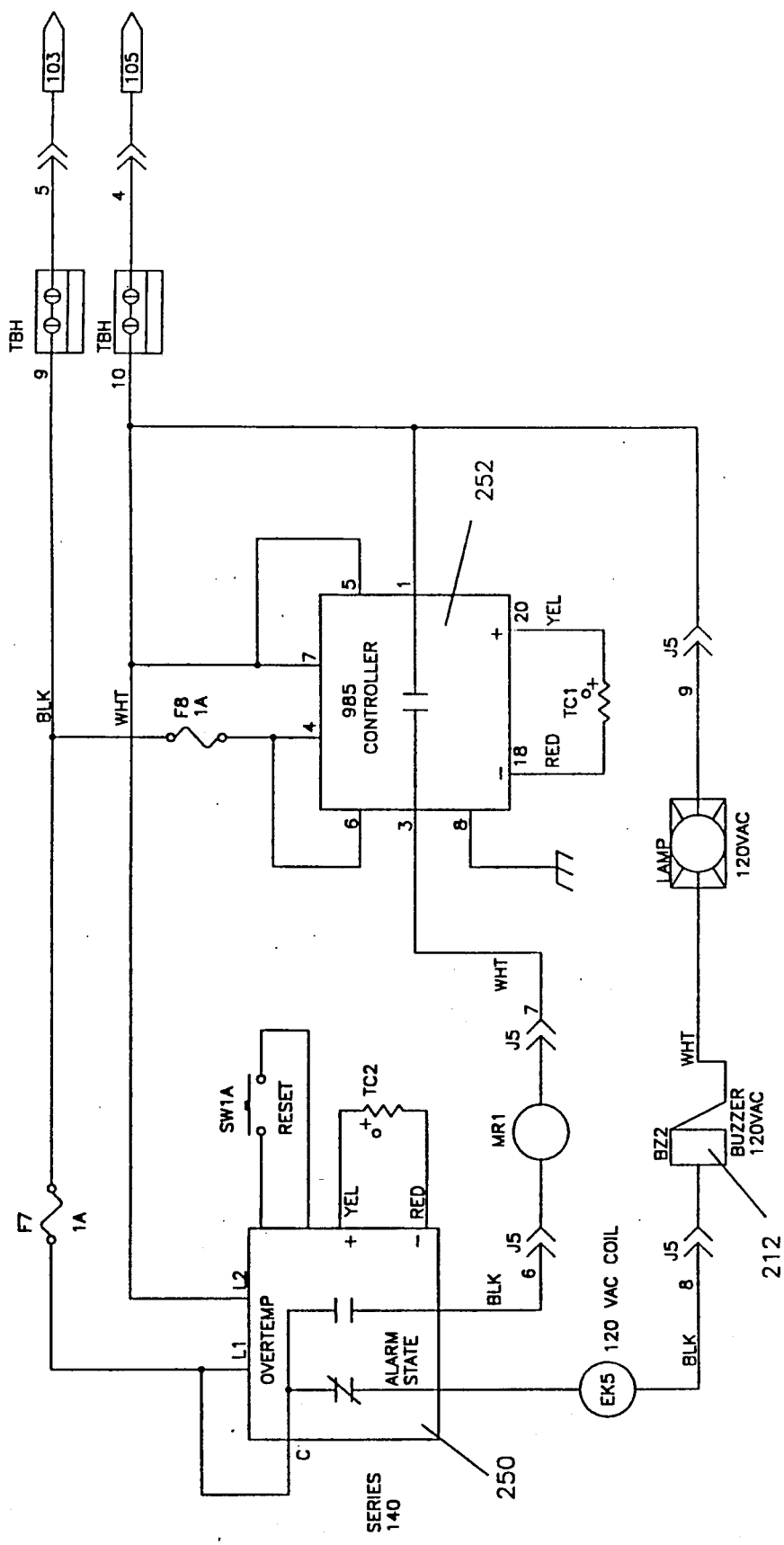
FIG. 16 illustrates a schematic diagram of an over temperature alarm and temperature controller for the electric heating panels for the quartz tank of the vapor dryer system.

FIG. 16 illustrates a schematic diagram of an over temperature alarm 250 and temperature controller 252 for the electric heating pads 30a-30n where all numerals correspond to those elements previously described.

Figure 17:
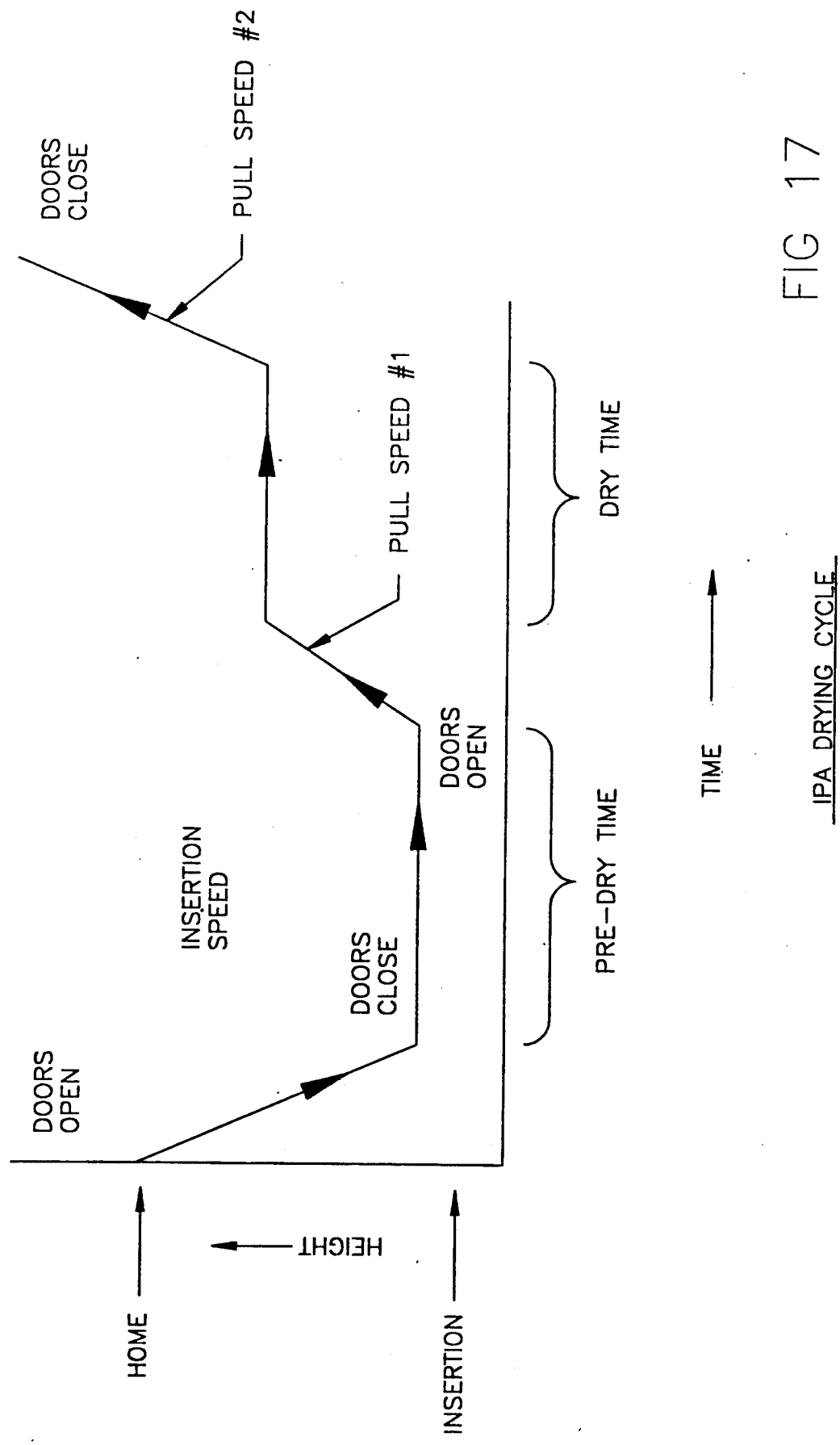
FIG. 17 illustrates the IPA drying cycle.

FIG. 17 illustrates the IPA drying cycle. The vapor dryer 10 processes semiconductor products through a cycle designed for effective drying. During this cycle, the semiconductor product is lowered into the vapor tank 12, and replacement of water with IPA takes place. Because of the difference in specific gravity between deionized (DI) water and IPA, the water enriched IPA sheds off the surface of the semiconductor product. This mixture of IPA and DI water is routed to the cool down buffer tank 82, and ultimately to the solvent drain.

This mixture is then removed from the vapor tank area and discharged. The drying cycle eliminates any possibility of condensation occurring and contaminating the semiconductor product. The semiconductor product in the vapor tank 12 only comes in contact with high purity IPA. The semiconductor product is then slowly raised upwardly to the home position. The semiconductor product remains at the home position until evaporation of IPA is complete. A representation of the drying process is shown in FIG. 17. Certain times and speeds, which are process variable can be adjusted. FIG. 17 represents a typical drying cycle. The basket 158 with product (wafers, masks, etc.) is lowered from the home position to the insertion height at a speed called the "insertion speed". Once there, it dwells for a period of time referred to as the "pre-dry time". After pre-dry time, the basket 158 is raised at the "pull speed #1" rate. When the lower/lift column 162 reaches the "dry position", the process will wait for the "dry (drip) time" to elapse. Then the lower/lift column 162 will raise back to the home position. When the doors closes, the process is complete.

Figure 18:
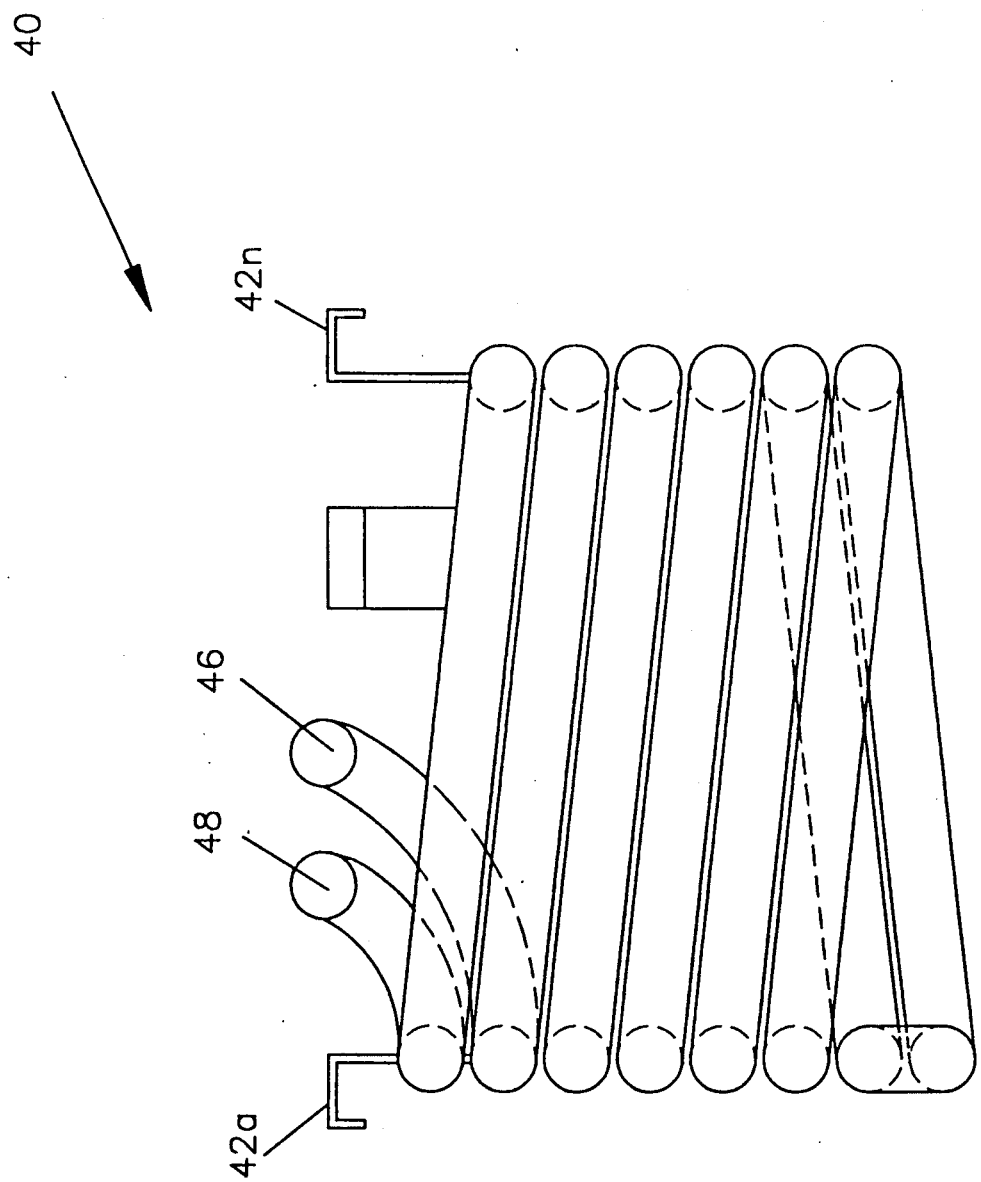
FIG. 18 illustrates an end view of the quartz cooling coil.

FIG. 18 illustrates an end view of the quartz cooling coil 40 including outlet end 46, inlet end 48 and brackets 42a–42n where all numerals correspond to those elements previously described.

Figure 19:
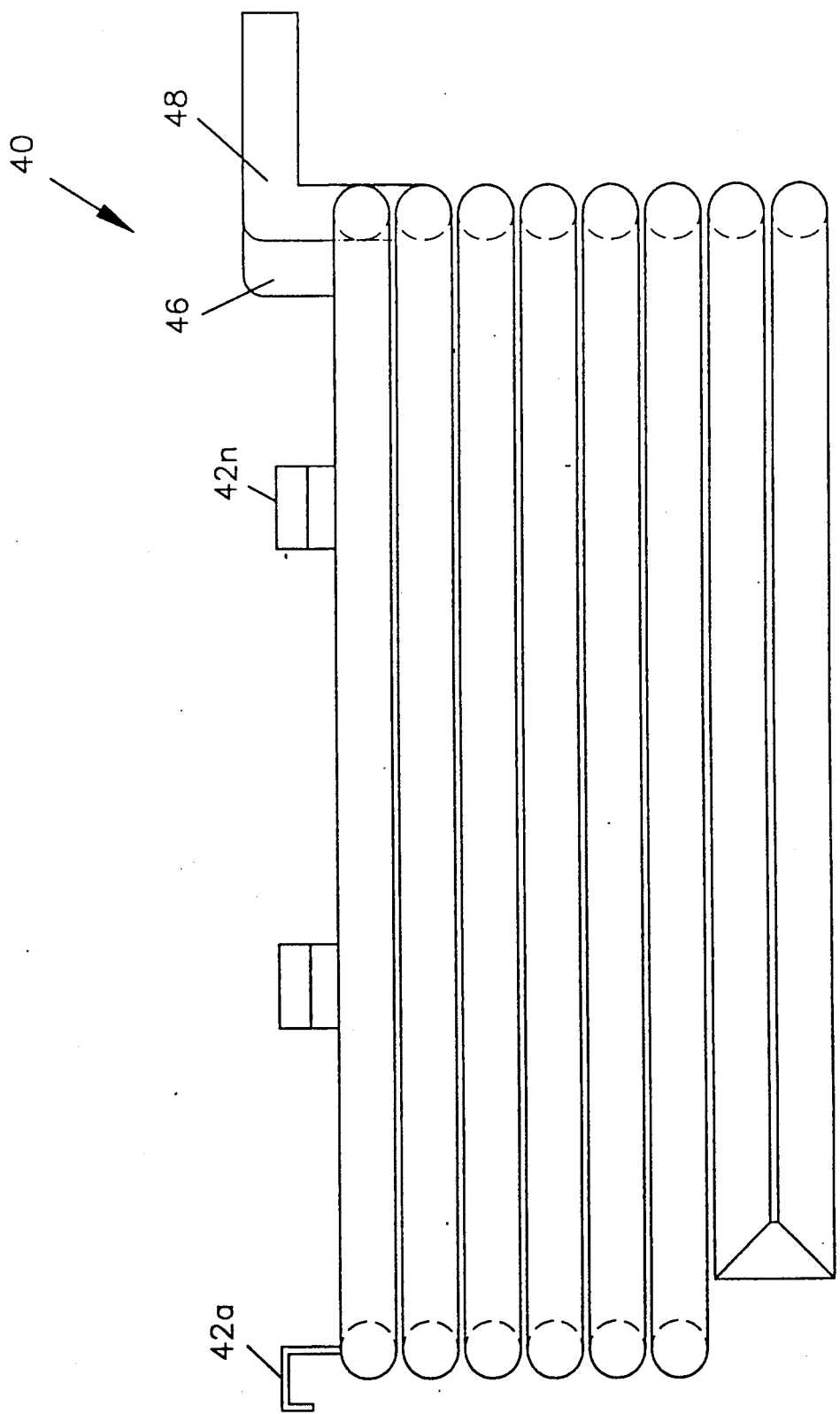
FIG. 19 illustrates a side view of the quartz cooling coil.

FIG. 19 illustrates a side view of the quartz cooling coil 40 where all numerals correspond to those elements previously described.

Figure 20:
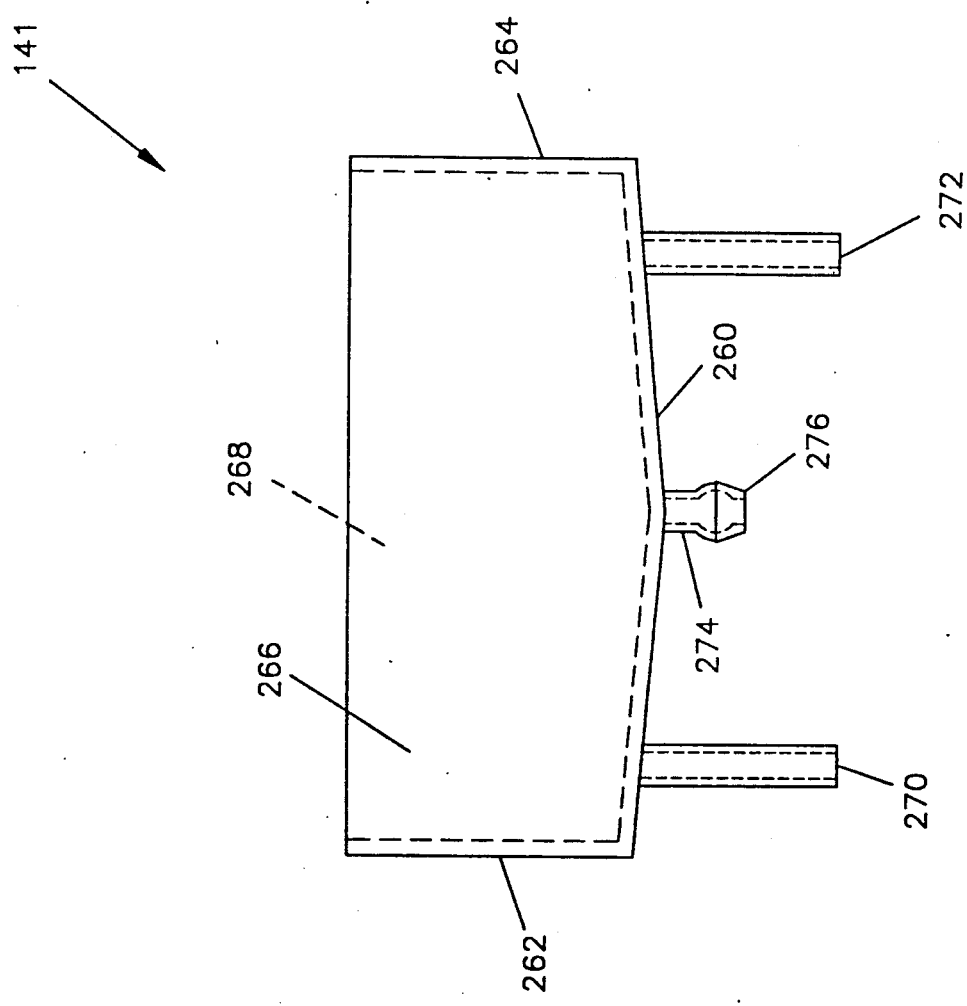
FIG. 20 illustrates an end view of the quartz saucer tray.

FIG. 20 illustrates an end view of the quartz saucer tray 141 where all numerals correspond to those elements previously described. Included in the quartz saucer tray are an angled bottom 260, sides 262 and 264, and ends 266 and 268. Support feet 270 and 272 extend vertically from the bottom 260. A drain tube 274 with a rounded ball connector end 276 extend vertically from the bottom 260.

Figure 21:
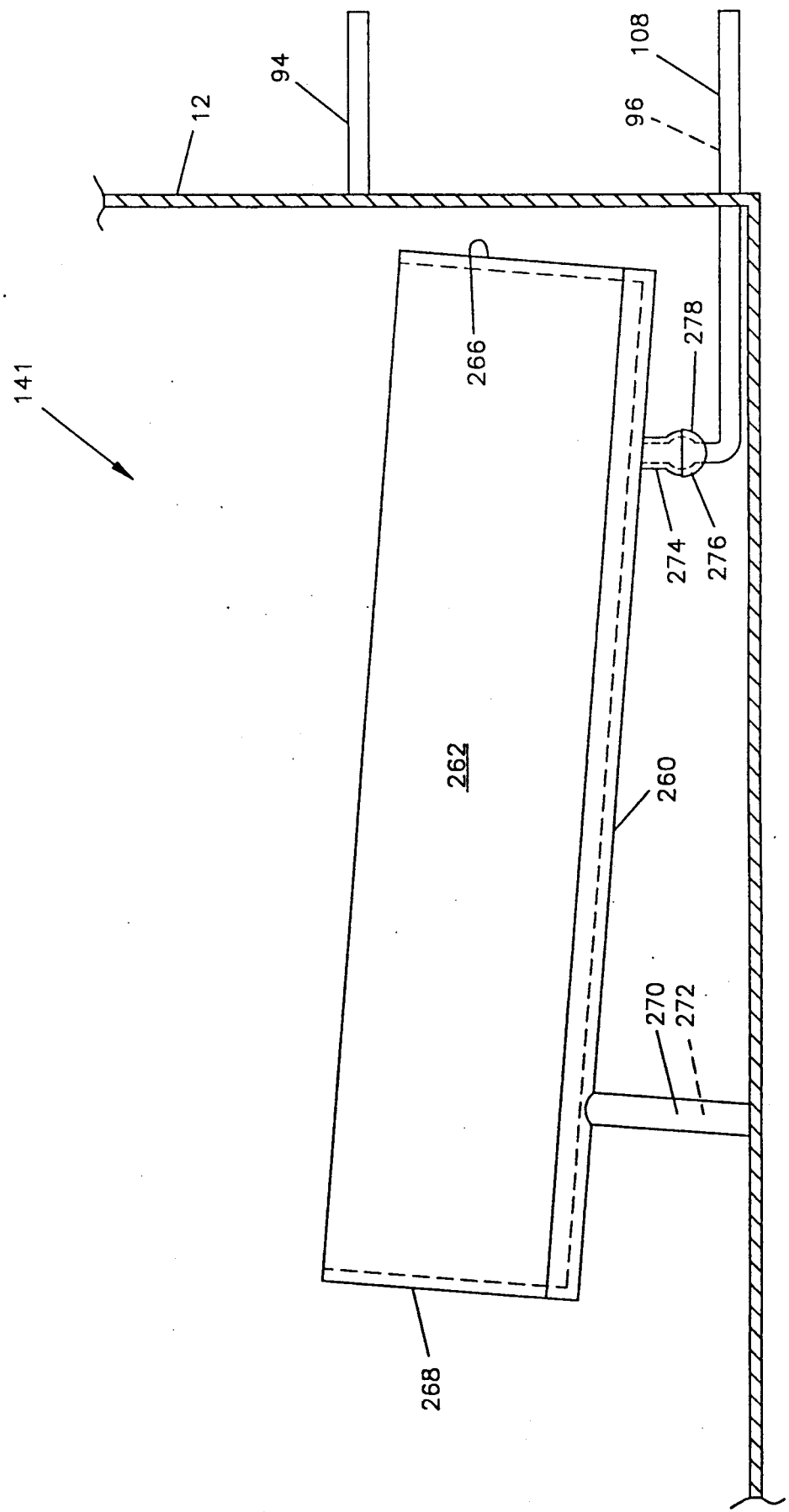
FIG. 21 illustrates a side view of the quartz saucer tray in a quartz tank.

FIG. 21 illustrates a side view of the quartz saucer tray 141 located inside of the quartz tank 12 where all numerals correspond to those elements previously described. The saucer tray 141 is supported by the feet 270 and 272 which rest on the bottom of the quartz tank 12 and also by the angled tube angled tube 108 includes a ball connector fitting 278 which mates with the ball connector fitting 276 to drain the saucer tray 141 through tube 108 as illustrated. The quartz saucer tray 141 is inclined toward the end with the drain tube 274, and the bottom 260 of the quartz saucer tray 141 is in the form of a "V" so that gravity can assist in the drainage of effluence from the quartz saucer tray 141.

MODE OF OPERATION

The vapor dryer processes semiconductor products through a cycle designed for effective drying. During this cycle, the semiconductor product is lowered into the vapor tank, and replacement of water with IPA takes place. Because of the difference in specific gravity between deionized (DI) water and IPA, the water enriched IPA sheds off the surface of the semiconductor product. This mixture of IPA and DI water is routed to a cool down buffer, and ultimately to the solvent drain. This mixture is then removed from the vapor tank area and discharged. The drying cycle eliminates any possibility of condensation occurring and contaminating the semiconductor product. The semiconductor product in the vapor tank only comes in contact with high purity IPA. The semiconductor product is then slowly raised to the home position. The semiconductor product remains at the home position until evaporation of the IPA is complete. The representation of the drying process is shown in FIG. 17.

FIG. 17 represents a typical drying cycle. The basket with product (wafers, masks, etc.) is lowered from the home position to the insertion height at a speed called the "insertion speed". Once there, it dwells for a period of time referred to as the "pre-dry time". After the pre-dry time, the basket is raised at the "pull speed #1" rate. When the arm reaches the "dry position", the process will wait for the "dry (drip) time" to elapse. Then, the arm will raise back to the home position. When the doors close, the process is complete.

The previous description of the preferred embodiments has included a discussion of the mode of operation. The sidewall heater pads preferably should adhere completely to each of the sidewalls and be connected to a separate temperature controller. While the block heater would be maintained in a range of 130°–300° F., nominally about 180°, the sidewall heaters are in the range of 130°–150° F., nominally at 150° F.

All important components in the process chamber area include the quartz tank, the quartz cooling coils and the quartz saucer. Contaminant draining from the substrates or wafers of the tank is done by gravity. The importance of this technique is to minimize or negate any changes to the IPA vapor blanket.

The step motor and drive assembly lowers and raises the wafer or substrate carriers in and out of the tank. This provides for slow to high speed insertion and withdrawal rates with minimal or no time lag. This also provides for accurate processing time, especially with other processing and scheduling equipment, such as on a wet bench.

For additional discussion of the mode of operation, see appendices entitled:

1. S and K Products International Model 28IFEL IPA Vapor Dryer;
2. I.P.A. Vapor Dryer; and,
3. Heater Mode Installation Manual.

Various modifications can be made to the present invention without departing from the apparent scope hereof. Other solutions can be utilized besides isopropyl alcohol, such as for other types of processes. The size and wattage of the electrical heating panels is dependent upon the processing parameters.

We claim:

1. Isopropyl alcohol vapor dryer system comprising:
   a. a stainless steel housing;
   b. a heater means in a base of said housing;
   c. a quartz tank mounted in said housing on said heater means;
   d. at least one independent side wall heater means positioned on a side wall of said quartz tank;
   e. a quartz saucer in a base of said quartz tank; and,
   f. a cooling coil adjacent an upper portion of said quartz tank.

2. System of claim 1 wherein said side wall heater means includes four side wall heaters, one on each of said side walls of said tank means.

3. System of claim 1 wherein said heater means in a base of said housing includes a plurality of heater rods.

4. System of claim 1 including robotic compatible access doors.

5. In combination, a quartz tank for IPA vapor dryer and a heating means for a vapor dryer for processing semiconductor wafers or substrates comprising:
   a. a quartz tank;

b. a base heating means for generating an IPA vapor; and, c. at least one independent heater means on a side wall of said quartz tank for maintaining said IPA vapor.

6. Process of generating an isopropyl alcohol uniform temperature vapor blanket in a quartz tank comprising the steps of:

a. heating a bottom of a quartz tank containing a finite amount of isopropyl alcohol for generating an IPA vapor; and, b. independently heating sides of said quartz tank by direct contact with a heating panel for maintaining said IPA vapor at a uniform vapor temperature.

7. Process of claim 6 for wafers of 4"–8".

8. An isopropyl alcohol vapor dryer system comprising:

a. a housing;

b. a quartz tank mounted in the housing for containing isopropyl alcohol, the tank having multiple side walls;

c. a wall heater means mounted against each of side walls for heating the quartz tank and the isopropyl alcohol; and, d. a separate block heater mounted on a bottom of said quartz tank.

9. The dryer system of claim 8 further comprising:

a. wherein the tank is substantially rectangular and has four side walls; and, b. said wall heater means includes a heater panel on each of said side walls.

10. An isopropyl alcohol vapor dryer system comprising:

a. a housing;

b. a quartz tank mounted in the housing having side walls;

c. a base heater mounted in the housing below the tank for heating isopropyl alcohol in the tank;

d. a cooling coil mounted in the housing adjacent an upper portion of the tank; and, e. an independent wall heater means for heating the side walls and for preventing vapor from condensing on the side walls.

11. The dryer system of claim 10 wherein the wall heater means includes a heat panel mounted on each side wall.

12. The dryer system of claim 10 further comprising a cooling jacket mounted adjacent the tank walls for cooling an upper portion of the tank.

13. A vapor dryer system comprising:

a. a housing;

b. a quartz tank, having multiple side walls, mounted in the housing;

c. a base heater means mounted in the housing below the tank for vaporizing liquid in the tank;

d. independent side wall heater means, mounted against the side walls, for maintaining vapor in a non-condensed state within the quartz tank;

e. a cooling jacket means mounted adjacent an upper portion of the tank for cooling the upper portion and preventing heat-generated air currents; and, f. a cooling coil means mounted above the tank adjacent said cooling jacket means for cooling and condensing vapor.

14. The system of claim 13 further comprising an air flow damper mounted in the housing between the tank and the housing for preventing turbulent air flow in the housing.

* * * * *